(12) United States Patent
Donofrio et al.

(10) Patent No.: US 9,397,266 B2
(45) Date of Patent: *Jul. 19, 2016

(54) LATERAL SEMICONDUCTOR LIGHT EMITTING DIODES HAVING LARGE AREA CONTACTS

(71) Applicant: CREE, INC., Durham, NC (US)

(72) Inventors: Matthew Donofrio, Raleigh, NC (US); James Ibbetson, Santa Barbara, CA (US); Zhimin James Yao, Goleta, CA (US)

(73) Assignee: CREE, INC., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/159,209

(22) Filed: Jan. 20, 2014

(65) Prior Publication Data

US 2014/0151735 A1    Jun. 5, 2014

Related U.S. Application Data

(63) Continuation of application No. 13/023,788, filed on Feb. 9, 2011, now Pat. No. 8,643,039, which is a continuation of application No. 12/463,709, filed on May 11, 2009, now Pat. No. 8,368,100, which is a (Continued)

(51) Int. Cl.
*H01L 33/20* (2010.01)
*H01L 33/40* (2010.01)
(Continued)

(52) U.S. Cl.
CPC .............. *H01L 33/405* (2013.01); *H01L 33/42* (2013.01); *H01L 33/486* (2013.01); *H01L 33/62* (2013.01);
(Continued)

(58) Field of Classification Search
CPC ....... H01L 33/40; H01L 33/42; H01L 33/405; H01L 33/10; H01L 33/32; H01L 33/36; H01L 33/20; H01L 33/22; H01L 33/0079
USPC ........ 257/98, 99, 95, 79, 13, 82, 88, E33.025, 257/E33.058, E33.064, E33.068, E33.074, 257/80, 116, 117, 431, 436, 451
See application file for complete search history.

(56) References Cited

U.S. PATENT DOCUMENTS 4,214,251 A    7/1980   Schairer
4,824,767 A    4/1989   Chambers et al. ............ 430/314
(Continued)

FOREIGN PATENT DOCUMENTS

CN         1816917        8/2006
DE       102007019776    10/2008
(Continued)

OTHER PUBLICATIONS

Office Action from U.S. Appl. No. 11/904,064. dated May 2, 2014.
(Continued)

*Primary Examiner* — Chuong A Luu
(74) *Attorney, Agent, or Firm* — Koppel, Patrick, Heybl & Philpott

(57) ABSTRACT

Light emitting diodes include a diode region having first and second opposing faces that include therein an n-type layer and a p-type layer, an anode contact that ohmically contacts the p-type layer and extends on the first face, and a cathode contact that ohmically contacts the n-type layer and also extends on the first face. The anode and cathode contacts extend on the first face to collectively cover substantially all of the first face. A small gap may be provided between the contacts.

38 Claims, 13 Drawing Sheets

Related U.S. Application Data continuation-in-part of application No. 11/985,410, filed on Nov. 14, 2007, and a continuation-in-part of application No. 12/329,713, filed on Dec. 8, 2008, now Pat. No. 8,575,633.

(51) Int. Cl.

| | | |
|---|---|---|
| *H01L 33/42* | (2010.01) | |
| *H01L 33/48* | (2010.01) | |
| *H01L 33/62* | (2010.01) | |
| H01L 33/22 | (2010.01) | |
| H01L 33/38 | (2010.01) | |
| H01L 33/46 | (2010.01) | |
| H01L 33/60 | (2010.01) | |

(52) U.S. Cl.
CPC .............. *H01L 33/20* (2013.01); *H01L 33/22* (2013.01); *H01L 33/38* (2013.01); *H01L 33/382* (2013.01); *H01L 33/46* (2013.01); *H01L 33/60* (2013.01); *H01L 2924/0002* (2013.01); *H01L 2933/0066* (2013.01)

(56) References Cited

U.S. PATENT DOCUMENTS

| | | | |
|---|---|---|---|
| 5,334,865 A | 8/1994 | Fathimulla et al. ............ 257/192 |
| 5,500,381 A | 3/1996 | Yoshida et al. ............... 438/172 |
| 5,563,079 A | 10/1996 | Shin et al. ..................... 438/571 |
| 5,712,175 A | 1/1998 | Yoshida ........................ 438/167 |
| 5,990,531 A | 11/1999 | Taskar et al. .................. 257/410 |
| 6,130,446 A * | 10/2000 | Takeuchi et al. ................ 257/99 |
| 6,197,609 B1 | 3/2001 | Tsutsui et al. |
| 6,375,340 B1 | 4/2002 | Biebl |
| 6,380,564 B1 | 4/2002 | Chen ............................... 257/94 |
| 6,395,572 B1 | 5/2002 | Tsutsui et al. .................. 438/46 |
| 6,410,942 B1 | 6/2002 | Thibeault et al. ............... 257/88 |
| 6,462,358 B1 | 10/2002 | Lin et al. ......................... 257/99 |
| 6,480,389 B1 | 11/2002 | Shie |
| 6,486,499 B1 | 11/2002 | Krames et al. .................. 257/81 |
| 6,489,637 B1 | 12/2002 | Sakamoto |
| 6,495,862 B1 | 12/2002 | Okazaki et al. ............... 257/103 |
| 6,586,813 B2 | 7/2003 | Nagahara ...................... 257/472 |
| 6,614,172 B2 | 9/2003 | Chiu et al. ..................... 313/501 |
| 6,642,652 B2 | 11/2003 | Collins et al. ................. 313/512 |
| 6,646,292 B2 | 11/2003 | Steigerwald et al. .......... 257/103 |
| 6,657,236 B1 | 12/2003 | Thibeault et al. ............... 257/98 |
| 6,741,029 B2 | 5/2004 | Matsubara |
| 6,784,462 B2 | 8/2004 | Schubert |
| 6,791,259 B1 | 9/2004 | Stokes |
| 6,828,596 B2 | 12/2004 | Steigerwald et al. ........... 257/99 |
| 6,869,812 B1 | 3/2005 | Liu |
| 6,885,036 B2 | 4/2005 | Tarsa et al. ..................... 257/99 |
| 6,888,171 B2 | 5/2005 | Liu et al. ......................... 257/99 |
| 6,946,309 B2 | 9/2005 | Camras et al. .................. 438/26 |
| 6,953,255 B2 | 10/2005 | Horiuchi |
| 7,049,639 B2 | 5/2006 | Wang ............................ 257/698 |
| 7,141,825 B2 | 11/2006 | Horio et al. ..................... 257/79 |
| 7,154,125 B2 | 12/2006 | Koide et al. .................... 257/95 |
| 7,348,212 B2 | 3/2008 | Schiaffino et al. ............ 438/106 |
| 7,439,166 B1 | 10/2008 | Milosavljevic et al. ....... 438/577 |
| 7,608,497 B1 | 10/2009 | Milosavljevic et al. ....... 438/182 |
| 7,622,742 B2 | 11/2009 | Kim et al. ....................... 257/79 |
| 7,622,746 B1 | 11/2009 | Lester et al. |
| 7,709,282 B2 | 5/2010 | Fukshima et al. .............. 438/26 |
| 7,781,791 B2 | 8/2010 | Sakai et al. ..................... 257/98 |
| D631,020 S | 1/2011 | Chuang ........................ D13/180 |
| 7,868,987 B2 | 1/2011 | Kamiya et al. ................. 257/99 |
| D646,643 S | 10/2011 | Wu .............................. D13/180 |
| D658,139 S | 4/2012 | Andrews ..................... D13/180 |
| 8,212,273 B2 | 7/2012 | McKenzie et al. |
| D675,169 S | 1/2013 | Chou .......................... D13/180 |
| 8,368,100 B2 * | 2/2013 | Donofrio ............. H01L 33/405 257/79 |
| D691,973 S | 10/2013 | Donofrio ..................... D13/180 |
| D693,781 S | 11/2013 | Kobayashi .................. D13/180 |
| D694,201 S | 11/2013 | Iino ............................ D13/180 |
| D698,323 S | 1/2014 | Noichi ........................ D13/180 |
| D709,464 S | 7/2014 | Abare .......................... D13/180 |
| D710,810 S | 8/2014 | Noichi ........................ D13/180 |
| D713,804 S | 9/2014 | Britt ........................... D13/180 |
| 8,835,959 B2 | 9/2014 | Nakamura .................... 257/103 |
| D718,725 S | 12/2014 | Reiherzer ................... D13/180 |
| D741,821 S | 10/2015 | Song ........................... D13/180 |
| D746,240 S | 12/2015 | Bergmann ................... D13/180 |
| 2002/0017648 A1 | 2/2002 | Kasahara et al. ............... 257/79 |
| 2002/0180351 A1 | 12/2002 | McNulty |
| 2003/0141506 A1 * | 7/2003 | Sano et al. ...................... 257/78 |
| 2003/0218183 A1 | 11/2003 | Micovic et al. |
| 2003/0227250 A1 | 12/2003 | Nee .............................. 313/495 |
| 2004/0016936 A1 | 1/2004 | Tanaka et al. .................. 257/98 |
| 2004/0217364 A1 | 11/2004 | Tarsa et al. |
| 2005/0082562 A1 | 4/2005 | Ou et al. ....................... 257/103 |
| 2005/0147923 A1 | 7/2005 | Sawada |
| 2005/0159009 A1 | 7/2005 | Makiyama et al. |
| 2005/0211989 A1 | 9/2005 | Horio et al. ..................... 257/79 |
| 2005/0224821 A1 | 10/2005 | Sakano |
| 2005/0242364 A1 | 11/2005 | Moustakas ................... 257/103 |
| 2005/0258431 A1 | 11/2005 | Smith et al. .................... 257/79 |
| 2005/0258450 A1 | 11/2005 | Saxler ......................... 257/192 |
| 2005/0258451 A1 | 11/2005 | Saxler et al. ................. 257/192 |
| 2006/0006414 A1 | 1/2006 | Germain et al. ............. 257/192 |
| 2006/0054907 A1 | 3/2006 | Lai ................................. 257/96 |
| 2006/0063289 A1 | 3/2006 | Negley |
| 2006/0081869 A1 | 4/2006 | Lu et al. ......................... 257/99 |
| 2006/0091405 A1 | 5/2006 | Kwak |
| 2006/0108606 A1 | 5/2006 | Saxler et al. .................. 257/200 |
| 2006/0273333 A1 | 12/2006 | Wu et al. ........................ 257/94 |
| 2006/0273335 A1 | 12/2006 | Asahara |
| 2007/0018182 A1 | 1/2007 | Beeson et al. .................. 257/98 |
| 2007/0018184 A1 | 1/2007 | Beeson et al. .................. 257/98 |
| 2007/0063215 A1 | 3/2007 | Kohda |
| 2007/0102715 A1 | 5/2007 | Ko et al. |
| 2007/0111473 A1 | 5/2007 | Furukawa et al. |
| 2007/0145380 A1 | 6/2007 | Shum et al. |
| 2007/0145392 A1 | 6/2007 | Haberern et al. ............... 257/97 |
| 2007/0200493 A1 | 8/2007 | Hsu ............................. 313/506 |
| 2007/0202624 A1 | 8/2007 | Yoon et al. ..................... 438/29 |
| 2007/0262338 A1 | 11/2007 | Higashi et al. .................. 257/99 |
| 2008/0064133 A1 | 3/2008 | Lee et al. ........................ 438/29 |
| 2008/0157115 A1 | 7/2008 | Chuang et al. ................. 257/99 |
| 2008/0182369 A1 | 7/2008 | Jeong et al. |
| 2008/0203541 A1 | 8/2008 | Makiyama ................... 257/640 |
| 2008/0217635 A1 | 9/2008 | Emerson et al. |
| 2008/0241757 A1 | 10/2008 | Xu et al. |
| 2008/0251858 A1 | 10/2008 | Ahn et al. |
| 2008/0258161 A1 | 10/2008 | Edmond ........................ 257/98 |
| 2008/0274431 A1 | 11/2008 | Nozaki et al. |
| 2008/0290364 A1 | 11/2008 | Kamiya et al. |
| 2008/0308832 A1 | 12/2008 | Hsieh et al. |
| 2009/0050907 A1 | 2/2009 | Yuan ............................. 257/88 |
| 2009/0108281 A1 | 4/2009 | Keller ............................ 257/98 |
| 2009/0121241 A1 * | 5/2009 | Keller et al. .................... 257/96 |
| 2009/0140272 A1 | 6/2009 | Beeson et al. |
| 2009/0283787 A1 | 11/2009 | Donofrio et al. |
| 2011/0163347 A1 | 7/2011 | Hasnain ......................... 257/99 |
| 2013/0105835 A1 | 5/2013 | Wu ................................ 257/89 |
| 2013/0328074 A1 | 12/2013 | Lowes ........................... 257/89 |

FOREIGN PATENT DOCUMENTS

| | | |
|---|---|---|
| DE | 102007046743 | 4/2009 |
| JP | 57042179 | 3/1982 |
| JP | 4284620 | 10/1992 |
| JP | 08111544 | 4/1996 |
| JP | 08111544 A | 4/1996 |
| JP | 9129532 | 5/1997 |
| JP | 09153646 | 6/1997 |
| JP | 09008403 | 10/1997 |
| JP | 10189649 | 7/1998 |
| JP | 11150298 | 6/1999 |
| JP | 2000311704 | 7/2000 |
| JP | 02299699 | 10/2002 |
| JP | 2002353499 | 12/2002 |

(56) References Cited

FOREIGN PATENT DOCUMENTS

| | | |
|---|---|---|
| JP | 03124522 | 4/2003 |
| JP | 2003347589 | 12/2003 |
| JP | 200447988 A | 2/2004 |
| JP | 2004047988 | 2/2004 |
| JP | 3105430 U | 10/2004 |
| JP | 200517289 A | 7/2005 |
| JP | 2005244152 | 9/2005 |
| JP | 2005123489 | 12/2005 |
| JP | 2006128727 | 5/2006 |
| JP | 2006216933 | 8/2006 |
| JP | 2006313888 | 11/2006 |
| JP | 2007073965 | 3/2007 |
| JP | 2007511065 | 4/2007 |
| JP | 200731704 | 11/2007 |
| JP | 2008112957 | 5/2008 |
| JP | 2008112957 A | 5/2008 |
| JP | 2008288548 | 11/2008 |
| JP | 2008288548 A | 11/2008 |
| JP | 2009049342 | 3/2009 |
| JP | 200988299 | 4/2009 |
| TW | 564584 | 12/2003 |
| TW | 200627674 | 8/2006 |
| TW | 200627675 | 8/2006 |
| WO | WO 8300408 | 2/1983 |
| WO | WO 2006006555 | 1/2006 |
| WO | WO 2007136391 | 11/2007 |
| WO | WO 2007136392 | 11/2007 |
| WO | WO 2007141763 | 12/2007 |
| WO | WO 2009039805 | 4/2009 |

OTHER PUBLICATIONS

Office Action from Taiwanese Patent Appl. No. 097114378, dated May 12, 2014.
Office Action from U.S. Appl. No. 11/904,064. dated Sep. 12, 2013.
Response to OA from U.S. Appl. No. 11/904,264. filed Nov. 11, 2013.
Office Action from U.S. Appl. No. 11/904,064, dated Jan. 7, 2014.
Second Office Action from Chinese Patent Appl. No. 201080026730.9 dated Apr. 9, 2014.
Allowance Decision from Taiwanese Patent Appl. No. 097114378, dated Sep. 5, 2014.
First Office Action from Chinese Patent Appl No. 201080026730.9, dated Oct. 23, 2013.
Notice of Reasons for Rejection from Japanese Patent Appl. No. 2009-132243. dated Oct. 1, 2013.
Office Action from Japanese Patent Appl No. 2012-510802, dated Oct. 8, 2013.
Rejection Decision from Chinese Patent Appl. No. 200880020777.7. dated Jul. 3, 2013.
Interrogatory from Japanese Patent Appl. No. 2010-504160, dated Jul. 16, 2013.
Preliminary Examination Report from Japanese Patent Appl. No. 2010-504160, dated Jun. 25, 2013.
Notice of Reasons for Rejection from Japanese Patent Application No. 2012-510802, dated May 21, 2013.
Interrogation from Japanese Patent Application No. 2009-132243, dated Apr. 23, 2013.
Fourth Office Action from Chinese Patent Appl. No. 200880020777. 7, dated Feb. 17, 2013.
Decision of Rejection from Japanese Patent Application No. 2009-132243, dated Oct. 2, 2012.
Notice of Reasons for Rejection from Japanese Patent Application 2010-534010, dated Jun. 26, 2012.
Office Action from U.S. Appl. No. 11/904,064, dated Jul. 26, 2012.
Response to OA from U.S. Appl. No. 11/904,064, filed Jan. 28, 2013.
Office Action from U.S. Appl. No. 12/432,478, dated Jun. 20, 2012.
Response to OA from U.S. Appl. No. 12/432,478, filed Aug. 17, 2012.
Office Action from U.S. Appl. No. 12/185,031, dated Jun. 12, 2012.
Response to OA from U.S. Appl. No 12/185,031, filed Aug. 24, 2012.
Office Action from U.S. Appl. No. 11/904,064, dated Feb. 25, 2013.
Response to OA from U.S. Appl. No, 11/904,064, filed May 24, 2013.
Office Action from U.S. Appl. No. 11/904,064, dated Jun. 12, 2013.
Response to OA from U.S. Appl. No. 11/904,064, filed Aug. 20, 2013.
Office Action from U.S. Appl. No. 13/023,788, dated Mar. 12, 2013.
Response to OA from U.S. Appl. No. 13/023,788, filed Jun. 11, 2013.
Office Action from U.S. Appl. No. 11/738,171, dated Jun. 27, 2013.
Office Action from U.S. Appl. No. 12/432,478, dated Jul. 1, 2013.
Office Action from U.S. Appl. No. 13/023,788, dated Jul. 2, 2013.
Extended European Search Report for European Patent Application No. 10185708.4, mailed Dec. 2, 2010.
International Search and Written Opinion for PCT application No. PCT/US2010/024980, mailed Oct. 6, 2010.
U.S. Appl. No. 12/463,709, filed May 11, 2009, entitled Semiconductor Light Emitting Diodes Having Reflective Structures and Methods of Fabricating Same.
U.S. Appl. No. 11/985,410, filed Nov. 14, 2007, Wire Bond Free Wafer Level LED.
U.S. Appl. No. 12/329,713, filed Dec. 8, 2008, Light Emitting Diode With Improved Light Extraction.
Huang et al. "High-Performance GaN-Based Vertical-Injection Light-Emitting diodes with $TiO_2$—$SiO_2$ Omnidirectional Reflector and n-GaN Roughness" IEEE Photonics Technology Letters, 19(8): 565-567 (2007).
Official Notice of Rejection for Japanese Patent Application No. 2006-513442, Jun. 8, 2010.
Office Action for Korean Patent Application No. 10-2005-7020463, mailed Dec. 21, 2010.
Grundbacher et al., "Utilization of an Electron Beam Resist Process to Examine the Effects of Asymmetric Gate Recess on the Device Characteristics of AlGaAs/InGaAs PHEMT's," IEEE, vol. 44, No. 12, Dec. 1997.
Office Action from U.S. Appl. No. 12/012,376, dated: Jul. 8, 2010.
Office Action from U.S. Appl. No. 12/012,376, dated: Dec. 3, 2010.
Office Action from U.S. Appl. No. 12/432,478, dated: Nov. 17, 2010.
Office Action from U.S. Appl. No. 11/904,064, dated: Apr. 22, 2011.
Office Action from U.S. Appl. No. 12/432,478, dated: May 16, 2011.
Office Action from U.S. Appl. No. 12/185,031, dated: Jun. 14, 2011.
Pretrial Report from Japanese Patent Appl. No. 2012-510802, dated Jul. 2, 2014.
Notification of the Fifth Office Action from Chinese Patent Appl. No. 200880020777.7. dated Jan. 21, 2015.
Decision of Dismissal of Amendment from Japanese Patent Appl. No. 2012-510802, dated Feb. 18, 2014.
Certificate of Patent for Invention from Chinese Patent Appl. No. ZL200880020777.7, dated Aug. 5, 2015.
Trial Decision from Japanese Patent Appl. No. 2012-510802, dated Jul. 21, 2015.
Office Action from U.S. Appl. No. 11/738,171, dated Sep. 14, 2015.
Office Action from U.S. Appl. No. 29/511,587; Apr. 5, 2016.
Steigerwald, Daniel A., et al; A GaInN Flip Chip Light Emitting Device Having High Reflectance OHMIC Contact; Nov. 22, 2002; Japanese Application No. 2002-33014.
Office Action for Application No. 2015-130167; Dated Mar. 9, 2016.

\* cited by examiner

LATERAL SEMICONDUCTOR LIGHT EMITTING DIODES HAVING LARGE AREA CONTACTS

CROSS-REFERENCE TO RELATED APPLICATIONS

The present application is a continuation of U.S. patent application Ser. No. 13/023,788, filed Feb. 9, 2011 now U.S. Pat. No. 8,643,039, entitled "Lateral Semiconductor Light Emitting Diodes Having Large Area Contacts", which itself is a continuation of U.S. patent application Ser. No. 12/463,709, filed May 11, 2009, now U.S. Pat. No. 8,368,100, issued Feb. 5, 2013, entitled, "Semiconductor Light Emitting Diodes Having Reflective Structures and Methods of Fabricating Same", which itself is a continuation-in-part application of U.S. application Ser. No. 11/985,410, entitled "Wire Bond Free Wafer Level LED", filed Nov. 14, 2007, and U.S. application Ser. No. 12/329,713, entitled "Light Emitting Diode With Improved Light Extraction", filed Dec. 8, 2008, now U.S. Pat. No. 8,575,633, issued Nov. 5, 2013. The disclosures of each application cited in this paragraph are hereby incorporated herein by reference as if set forth in their entirety herein.

STATEMENT REGARDING FEDERALLY SPONSORED RESEARCH

The present invention was developed with Government support under Contract No. 70NANB4H3037 of the Department of Commerce. The Government has certain rights in this invention.

BACKGROUND OF THE INVENTION

This invention relates to semiconductor light emitting devices and methods of fabricating same, and more particularly to semiconductor Light Emitting Diodes (LEDs) and fabrication methods therefor.

Semiconductor LEDs are widely known solid-state lighting elements that are capable of generating light upon application of voltage thereto. LEDs generally include a diode region having first and second opposing faces, and including therein an n-type layer, a p-type layer and a p-n junction. An anode contact ohmically contacts the p-type layer and a cathode contact ohmically contacts the n-type layer. The diode region may be epitaxially formed on a substrate, such as a sapphire, silicon, silicon carbide, gallium arsenide, gallium nitride, etc., growth substrate, but the completed device may not include a substrate. The diode region may be fabricated, for example, from silicon carbide, gallium nitride, gallium phosphide, aluminum nitride and/or gallium arsenide-based materials and/or from organic semiconductor-based materials. Finally, the light radiated by the LED may be in the visible or ultraviolet (UV) regions, and the LED may incorporate wavelength conversion material such as phosphor.

LEDs are increasingly being used in lighting/illumination applications, with one ultimate goal being a replacement for the ubiquitous incandescent lightbulb.

SUMMARY OF THE INVENTION

Light emitting diodes according to various embodiments include a diode region having first and second opposing faces and including therein an n-type layer and a p-type layer, an anode contact that ohmically contacts the p-type layer and extends on the first face and a cathode contact that ohmically contacts the n-type layer and also extends on the first face. The anode contact and/or the cathode contact further include a reflective structure on the first face that is configured to reflect substantially all light that emerges from the first face back into the first face. In some embodiments, the reflective structure reflects the light that emerges from at least 90% of an area of the first face back into the first face. Moreover, the reflective structure itself may be configured to reflect at least 90% of the light that impinges thereon. Accordingly, embodiments of the present invention can provide lateral light emitting diodes having both contacts on a given face thereof and an integral reflective structure. The lateral light emitting diodes may be used in a flip-chip configuration, such that the contacts may be used to mount the LED on a packaging substrate, and the light emerges from the light emitting diode from a face other than the first face.

In some embodiments, the reflective structure comprises a reflective surface of the anode contact that ohmically contacts the p-type layer, a reflective surface of the cathode contact, and a reflective surface of an extension of the cathode contact. The reflective structure further includes a transparent insulating layer beneath the cathode contact and its extension. In some of these embodiments, a barrier layer may be provided on the anode contact including on sidewalls thereof, and the reflective structure can reflect all the light that emerges from the first face back into the first face, except for light that is absorbed by the barrier layer on the sidewalls of the anode contact. In other embodiments, the anode contact is transparent, and the reflective structure further comprises a reflective surface of an extension of the cathode contact that extends onto the transparent anode contact. The transparent insulating layer also may extend beneath the extension of the cathode content that is on the transparent anode contact. In some of these embodiments, a current spreading layer may be provided on the transparent anode contact and the reflective structure can reflect all the light that emerges from the first face back into the first face, except for light that is absorbed by the current spreading layer.

A transparent substrate may be provided on a second face in any of these embodiments, so that the light emerges from the transparent substrate. The transparent substrate can include an outer face that is remote from the diode region, and the outer face can be differently textured in a first portion thereof than a second portion thereof, so as to provide an orientation indicator for the light emitting diode.

In other embodiments, an anode pad is electrically connected to the anode contact and a cathode pad is electrically connected to the reflective cathode contact. The anode and the cathode pad extend on the first face in closely spaced apart relation to one another, to define a gap therebetween. Moreover, in some embodiments, the light emitting diode is flip-chip mounted on a mounting substrate, such that the anode and cathode pads are adjacent the mounting substrate, and the diode region is remote from the mounting substrate.

Light emitting diodes according to other embodiments comprise a diode region including therein an n-type layer and a p-type layer, and a contact for one of the n-type layer or the p-type layer. The contact includes a transparent insulating layer on one of the n-type layer or the p-type layer that has an index of refraction that is less than the one of the n-type layer or the p-type layer. A reflective layer electrically contacts the one of the n-type layer or the p-type layer, and extends on the transparent insulating layer. In some embodiments, the reflective layer electrically contacts the one of the n-type layer or the p-type layer by extending through the transparent insulating layer and extending on the transparent insulating layer. In other embodiments, the reflective layer ohmically contacts the one of the n-type layer or the p-type layer. The transparent insulating layer and the reflective layer can provide a hybrid reflective structure or "hybrid mirror", wherein the underlying transparent insulating layer provides an index of refraction mismatch or index step to enhance the total internal reflection (TIR) from the diode region compared to absence of the underlying transparent insulating layer.

In still other embodiments, the contact is a first contact and the reflective layer is a first reflective layer, and the light emitting diode further includes a second contact for the other of the n-type layer or the p-type layer. The second contact comprises a second reflective layer that ohmically contacts the other of the n-type layer or the p-type layer. In still other embodiments, a second contact for the other of the n-type layer or the p-type layer comprises a transparent conductive layer that ohmically contacts the other of the n-type layer or the p-type layer, and the transparent insulating layer and the reflective layer both extend onto the transparent conductive layer. In some embodiments, the transparent conductive layer has an index of refraction between that of the other of the n-type layer or the p-type layer and the transparent insulating layer. Moreover, in any of these embodiments, the first and second contacts can both extend from on the first face of the diode region and a transparent substrate can be provided on the second face that has an index of refraction that is about the same as the diode region. The substrate can thereby enhance light extraction.

Light emitting diodes according to still other embodiments include a diode region having first and second opposing faces and including an n-type layer and a p-type layer. A reflective anode contact ohmically contacts the p-type layer and extends on the first face. A reflective cathode contact also ohmically contacts the n-type layer and extends on the first face. The reflective anode contact and the reflective cathode contact are configured to collectively reflect substantially all light that emerges from the first face back into the first face. The reflective anode contact may comprise a reflective layer and a barrier layer as described above. In other embodiments, the reflective cathode contact may comprise a transparent insulating layer and a reflective layer, as described above.

Light emitting diodes according to yet other embodiments include a diode region having first and second opposing faces and including therein an n-type layer and a p-type layer. An anode contact ohmically contacts the p-type layer and extends on the first face. A transparent insulating layer extends on the first face outside the anode contact. A reflective cathode contact electrically contacts the n-type layer and extends through the transparent insulating layer and onto the transparent insulating layer that is outside the anode contact, to cover substantially all of the first face that is outside the anode contact with the reflective cathode contact. In some embodiments, the transparent insulating layer also extends onto the anode contact and the reflective cathode contact also extends onto the transparent insulating layer that is on the anode contact, to cover substantially all of the first face that is outside the anode contact with the reflective cathode contact and to also cover at least a portion of the anode contact with the reflective cathode contact. Moreover, some embodiments include a via that extends into the first face to expose the n-type layer and the transparent insulating layer extends into the via. The reflective cathode contact also extends on the transparent insulating layer into the via to electrically contact the n-type layer that is exposed in the via. The transparent insulating layer and the reflective layer can provide a hybrid reflective structure or "hybrid mirror", wherein the underlying transparent insulating layer provides an index of refraction mismatch or index step to enhance the TIR from the diode region compared to absence of the underlying transparent insulating layer.

In some embodiments, the reflective cathode contact directly ohmically contacts the n-type layer. However, in other embodiments, an ohmic contact is provided that directly ohmically contacts the n-type layer and the reflective cathode contact is on the ohmic contact. Moreover, in some embodiments, the transparent insulating layer may comprise a plurality of transparent sublayers to provide, for example, a distributed Bragg reflector and/or the reflective layer may include a plurality of sublayers.

Some embodiments include a reflective anode contact, whereas other embodiments include a transparent anode contact. Thus, in some embodiments, the anode contact comprises a reflective anode contact that ohmically contacts the p-type layer and extends on the first face. The reflective anode contact may include sidewalls, and the light emitting diode may further comprise a barrier layer on the reflective anode contact, including on the sidewalls thereof.

In other embodiments, the anode contact comprises a transparent anode contact that ohmically contacts the p-type layer and extends on the first face. A current spreading layer may also be provided on a portion of the transparent anode contact. The transparent insulating layer may extend onto the transparent anode contact and the reflective cathode contact may also extend onto the transparent insulating layer that is on the transparent anode contact, to cover at least a portion of the transparent anode contact with the reflective cathode contact. Moreover, where a current spreading layer is present on a portion of the transparent anode contact, the transparent insulating layer may extend onto the transparent anode contact that is outside the portion and the reflective cathode contact may also extend onto the transparent insulating layer that is on the transparent anode contact outside the portion, to cover the transparent anode contact that is outside the portion with the reflective cathode contact.

Any of the above-described embodiments may include an anode pad that is electrically connected to the anode contact and a cathode pad that is electrically connected to the reflective cathode contact. The anode and cathode pads may extend on the first face in closely spaced apart relation to one another to define a gap therebetween. In some embodiments, the anode pad and the cathode pad both extend on the reflective anode contact and the reflective anode contact includes a break therein that corresponds to the gap, so as to allow the cathode and anode pads to be electrically insulated from one another. In these embodiments, the light emitting diode may further include a reflective layer that is insulated from the anode pad and/or the cathode pad, and that extends across the break. Moreover, in some embodiments, the reflective cathode contact also provides a plating seed layer, and the anode and cathode pads are plated anode and cathode pads on the seed layer. In other embodiments, a separate plating seed layer may be provided. In still other embodiments, the light emitting diode is flip-chip mounted on the mounting substrate such that the anode and cathode pads are adjacent the mounting substrate and the diode region is remote from the mounting substrate.

In other embodiments, a transparent substrate may be included on the second face. The transparent substrate may include an outer face that is remote from the diode region. The transparent substrate can enhance light extraction. The outer face can be differently textured in a first portion thereof than a second portion thereof, so as to provide an orientation indicator for the light emitting diode. In still other embodiments, a substrate is not included, and the second opposing face of the diode region may be textured, with or without the orientation indicator.

Light emitting diodes according to still other embodiments include a diode region having first and second opposing faces, and including therein an n-type layer and a p-type layer. A transparent anode contact ohmically contacts the p-type layer and extends on the first face. A transparent cathode contact ohmically contacts the n-type layer and also extends on the first face. A transparent insulating layer extends on the first face including on the transparent anode contact and the transparent cathode contact. A reflective layer is provided on the transparent insulating layer that substantially covers the first face. The transparent insulating layer and the reflective layer can provide a hybrid reflective structure or "hybrid mirror", wherein the underlying transparent insulating layer provides an index of refraction mismatch or index step to enhance the TIR from the diode region compared to absence of the underlying transparent insulating layer.

In some embodiments, a current spreading layer may be provided between the transparent anode contact and the reflective layer and between the transparent cathode contact and the reflective layer. In some embodiments, the reflective layer includes first and second portions, and the current spreading layer electrically connects the transparent anode contact to the first portion and electrically connects the transparent cathode contact to the second portion. Moreover, in other embodiments, the transparent anode contact and the transparent cathode contact both comprise transparent conductive metal oxide, such as indium tin oxide. The reflective layer comprises an elemental metal layer that is spaced apart from the first face, such that the first face is free of direct contact with elemental metal.

As to other materials, in some embodiments, the diode region comprises a Group III-nitride, such as gallium nitride-based material. The transparent insulating material comprises silicon dioxide, and the reflective cathode contact comprises aluminum. The reflective anode contact comprises nickel and silver. The transparent anode contact comprises indium tin oxide. Moreover, the transparent substrate comprises silicon carbide. Other materials may be used in other embodiments.

Methods of fabricating light emitting diodes also may be provided according to other embodiments. In some embodiments, a via is etched through a p-type layer at a first face of a diode region to expose an n-type layer therein. An anode contact is formed on the first face that ohmically contacts the p-type layer. A transparent insulating layer is formed on sidewalls of the via and extending onto the first face outside the via. A reflective cathode contact is formed that ohmically contacts the n-type layer on a floor of the via and that extends on the transparent layer that is on the sidewalls of the via and on the transparent layer that is on the first face outside the via.

More specifically, the anode contact may be formed by forming a transparent anode contact that ohmically contacts the p-type layer and extends on the first face. A current spreading layer may then be formed on a portion of the transparent anode contact. Moreover, the transparent insulating layer may be formed to extend on the transparent anode contact, and the reflective cathode contact may also extend on the transparent insulating layer that is on the transparent anode contact. In other embodiments, the anode contact may be fabricated by forming a reflective layer that ohmically contacts the p-type layer and forming a barrier layer on the reflective layer including on the sidewalls thereof. Moreover, the transparent insulating layer may be formed by blanket forming a transparent insulating layer and opening vias in the transparent insulating layer that extend to the n-type layer and the p-type layer. Analogous methods may be provided to fabricate the other embodiments described herein.

DETAILED DESCRIPTION

Figure 1:
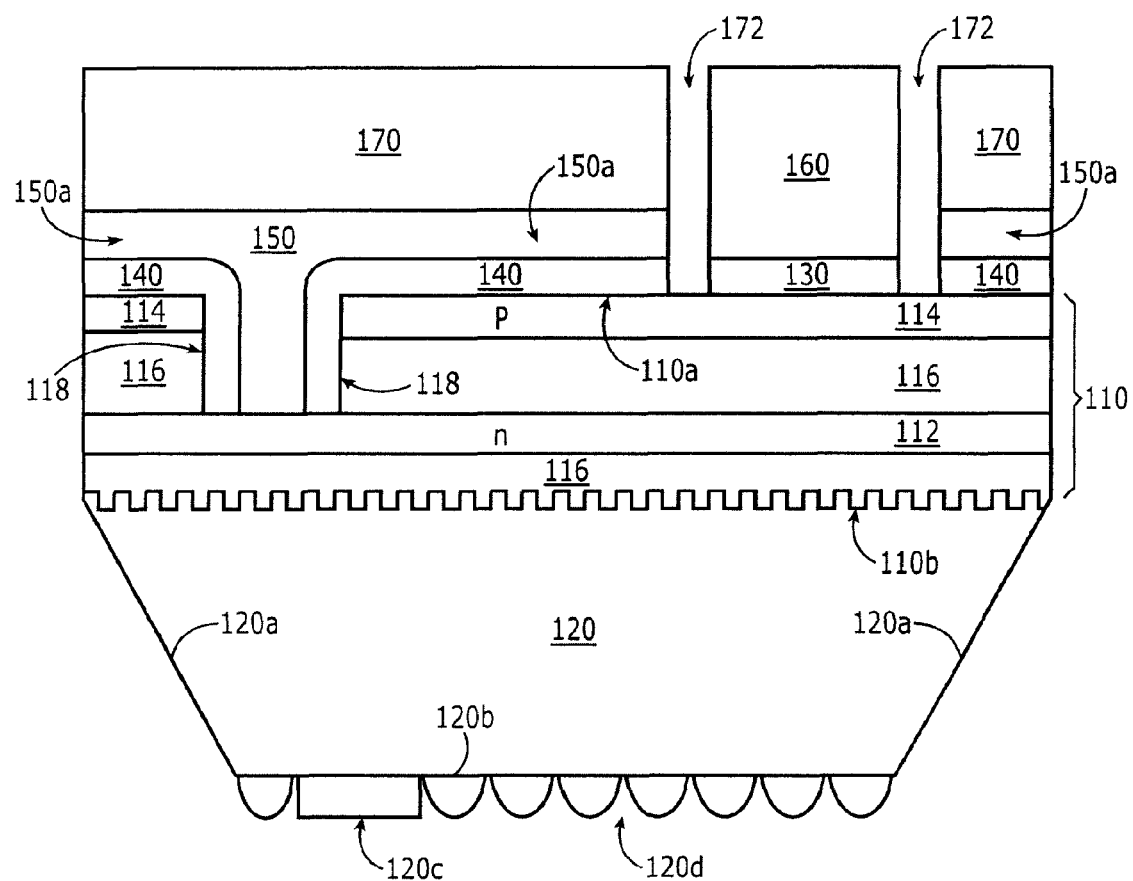
FIGS. 1-4 are cross-sectional views of light emitting diodes according to various embodiments.

The present invention now will be described more fully with reference to the accompanying drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As used herein, a layer or region of an LED is considered to be "transparent" when at least 90% of the radiation from the LED that impinges on the transparent layer or region emerges through the transparent region. For example, in the context of blue and/or green LEDs that are fabricated from gallium nitride-based materials, silicon dioxide can provide a transparent insulating layer (for example, at least 90% transparent), whereas indium tin oxide (ITO) can provide a transparent conductive layer (for example, at least 90% transparent) as measured by considering transmitted and reflected components on a sapphire substrate. Moreover, as used herein, a layer or region of an LED is considered to be "reflective" when at least 90% of the angle averaged radiation that impinges on the reflective layer or region from the LED is reflected back into the LED. For example, in the context of gallium nitride-based blue and/or green LEDs, aluminum (for example, at least 90% reflective) may be considered reflective materials. In the case of ultraviolet (UV) LEDs, appropriate materials may be selected to provide a desired, and in some embodiments high, reflectivity and/or a desired, and in some embodiments low, absorption.

Some embodiments now will be described generally with reference to gallium nitride (GaN)-based light emitting diodes on silicon carbide (SiC)-based mounting substrates for ease of understanding the description herein. However, it will be understood by those having skill in the art that other embodiments of the present invention may be based on a variety of different combinations of mounting substrate and epitaxial layers. For example, combinations can include AlGaInP diodes on GaP mounting substrates; InGaAs diodes on GaAs mounting substrates; AlGaAs diodes on GaAs mounting substrates; SiC diodes on SiC or sapphire ($Al_2O_3$) mounting substrates and/or a Group III-nitride-based diode on gallium nitride, silicon carbide, aluminum nitride, sapphire, zinc oxide and/or other mounting substrates. Moreover, in other embodiments, a mounting substrate may not be present in the finished product. In some embodiments, the light emitting diodes may be gallium nitride-based LED devices manufactured and sold by Cree, Inc. of Durham, N.C.

FIG. 1 is a cross-sectional view of a light emitting diode according to various embodiments. Referring to FIG. 1, these light emitting diodes include a diode region 110 having first and second opposing faces 110a, 110b, respectively, and including therein an n-type layer 112 and a p-type layer 114. Other layers or regions 116 may be provided which may include quantum wells, buffer layers, etc., that need not be described herein. The diode region 110 also may be referred to herein as an "LED epi region", because it is typically formed epitaxially on a substrate 120. For example, a Group III-nitride based LED epi 110 may be formed on a silicon carbide growth substrate 120. In some embodiments, as will be described below, the growth substrate 120 may be present in the finished product. In other embodiments, the growth substrate 120 may be removed.

Continuing with the description of FIG. 1, an anode contact 130, also referred to as a "p-contact", ohmically contacts the p-type layer 114 and extends on the first face 110a of the diode region 110. The anode contact 130 may extend to a greater or less extent on the p-type layer 114 than illustrated in FIG. 1. A transparent insulating layer 140 also extends on the first face 110a outside the anode contact 130. A reflective cathode contact 150, also referred to as an "n-contact" electrically contacts the n-type layer 112 and extends through the transparent insulating layer 140 and onto the transparent insulating layer 140 that is outside the anode contact 130. In some embodiments, the reflective cathode contact 150 may directly and ohmically contact the n-type layer 112. In other embodiments, however, a thin ohmic contact layer, such as a layer of titanium, may provide the actual ohmic contact to the n-type layer 112. The transparent insulating layer 140 and the reflective cathode contact 150 can provide a hybrid reflective structure or "hybrid mirror", wherein the underlying transparent insulating layer 140 provides an index refraction mismatch or index step to enhance the total internal reflection (TIR) from the reflective layer 150 compared to absence of the underlying transparent insulating layer 140. It will also be understood that, in other embodiments, the transparent insulating layer 140 may comprise multiple sublayers, such as oxide and nitride sublayers to provide, for example, a distributed Bragg reflector. Moreover, the reflective cathode contact 150 may also include a plurality of sublayers.

As also shown in FIG. 1, in some embodiments, a via 118 extends into the first face 110a to expose the n-type layer 112, and the transparent insulating layer 140 extends into the via 118. Moreover, the reflective cathode contact 150 also extends on the transparent insulating layer 140 into the via 118, to electrically, and in some embodiments ohmically, contact the n-type layer 112 that is exposed in the via 118.

An anode pad 160 also is provided that is electrically connected to the anode contact 130. A cathode pad 170 is also provided that is electrically connected to the reflective cathode contact 150. As shown, the anode and cathode contact pads 160 and 170 extend on the first face 110a in closely spaced apart relation to one another, to define a gap 172 therebetween. The gap may be filled with an insulator as described below. In any embodiments illustrated herein, the gap 172 may occur at any desired position and is not limited to the position illustrated herein. In some embodiments, the cathode pad 170 may be made as large as possible, so that it can be directly coupled to a grounded heat sink for enhanced thermal dissipation in a flip-chip mounting configuration, without the need for an intervening electrically insulating layer that could reduce thermal efficiency.

As also shown in FIG. 1, a transparent substrate, such as a transparent silicon carbide growth substrate 120, may be included on the second face 110b of the diode region 110. The transparent substrate 120 may include beveled sidewalls 120a and may also include an outer face 120b that is remote from the diode region 110. As shown, the outer face 120b may be textured. The thickness of the substrate 120, the resistivity of the substrate, geometry of the sidewalls 120a and/or the texturing of the remote face 120b may be configured to enhance the far field emission of radiation from the diode region 110 through the substrate 120. The emission from the diode region 110 may take place directly from the diode region 110 through the substrate 120 and may also take place by reflection from the reflective cathode contact 150 back through the diode region 110 and through the substrate 120. In some embodiments, reflection may also take place from the anode contact 130, as will be described in detail below.

As also shown in FIG. 1, in some embodiments, when the transparent substrate 120 is sapphire, Patterned Sapphire Substrate (PSS) technology may be used to texture the interface between the sapphire substrate 120 and the diode region 110, as shown by the jagged interface between the substrate 120 and the second face 110b of the diode region 110. As is well known, PSS technology may provide texture features that may be, for example, about 3 µm in size on an about 5 µm pitch. The use of PSS technology can enhance the extraction efficiency between the gallium nitride-based diode region 110 and the index mismatched sapphire substrate 120.

Accordingly, some embodiments of the invention can provide an LED that is suitable for flip-chip mounting (i.e., mounting opposite the orientation of FIG. 1), wherein the anode pad 160 and the cathode pad 170 are mounted on a supporting substrate, such as a printed circuit board or other wiring board, and emission of light takes place through the substrate 120 remote from the anode pad 160 and the cathode pad 170. Thus, a lateral LED may be provided wherein both the anode contact 130 and the cathode contact 150 extend on a given face of the diode region (i.e., the first face 110a), and emission takes place remote from the anode and cathode contacts 130 and 150, respectively, through the second face 110b of the diode region, and through the substrate 120. In other embodiments, the substrate may be removed so that emission takes place directly from the second face 110b of the diode region 110.

As was noted above, the geometry of the substrate 120 may be configured to provide a desired far field emission pattern, such as Lambertian emission. Moreover, texturing may take place on the sidewalls 120a and/or on the face 120b of the substrate 120. Many different configurations of texturing may be used including random texturing, microlenses, microarrays, scattering regions and/or other optical regions. According to some embodiments, the outer face 120b may be differently textured in a first portion 120c thereof than a second portion 120d thereof, so as to provide an orientation indicator for the light emitting diode. Thus, as shown in FIG. 1, an array of microlenses 120d may be provided except at a given area adjacent the transparent cathode contact, wherein a small bar 120c or other indicator, such as a "+" sign, may be provided. The different texturing on the remote face 120b of the substrate can provide an orientation indicator that can allow pick-and-place equipment to correctly orient the LED for packaging, even if the structure of the LED is not "visible" to the pick-and-place equipment through the textured substrate.

In some embodiments, the anode contact and/or the cathode contact can provide a reflective structure on the first face 110a that is configured to reflect substantially all light that emerges from the first face 110a back into the first face 110a. The reflective structure further includes the transparent insulating layer 140 beneath the cathode contact 150 and extensions thereof 150a. In particular, in some embodiments, the reflective structure reflects the light that emerges from at least 90% of an area of the first face 110a. The reflective structure may comprise reflective materials that themselves reflect at least 90% of the light that impinges thereon. In some embodiments, the anode contact 130 may be a reflective anode contact that ohmically contacts the p-type layer 114. In these embodiments, the reflective structure may be provided by a reflective surface of the anode contact 130 that ohmically contacts the p-type layer 114, a reflective surface of the cathode contact 150 that ohmically contacts the n-type layer 112 and a reflective surface of extensions of the cathode contact, identified as 150a in FIG. 1, that extend onto the first face 110a between the via 118 and the anode contact 130, in combination with the transparent insulating layer 140. In other embodiments, the anode contact 130, may be transparent, and the reflective cathode contact 150, specifically the extensions 150a of the reflective cathode contact 150, may extend onto the transparent anode contact 130 to provide a reflective structure in combination with the transparent insulating layer 140. Thus, in some embodiments, the reflective cathode contact can extend to cover substantially all of the first face that is outside the anode contact with the reflective cathode contact. In other embodiments, the reflective cathode contact can cover substantially all of the first face that is outside the anode contact with the reflective cathode contact, and also can cover at least a portion of the anode contact with the reflective cathode contact. More detailed embodiments will be described below.

Accordingly, some embodiments may provide LEDs with a lateral flip-chip configuration. Some embodiments may provide dual mirrors on the p-type and n-type layers. Moreover, the n-type mirror may be an integrated n-contact mirror that can make electrical contact with at least one n-type layer of the LED epi, and can also extend over at least one p-type contact of the LED epi. The integrated n-contact mirror may include a material, such as aluminum, that is optically reflective to wavelengths generated by the LED epi. The transparent insulating layer and the reflective layer can provide a hybrid reflective structure or "hybrid mirror", wherein the underlying transparent insulating layer provides an index of refraction mismatch or index step to enhance the TIR from the diode region compared to absence of the underlying transparent insulating layer. Moreover, the light emitting face of the LED chip, opposite the mirror(s), may include a growth substrate. The growth substrate may further include a shaped surface, such as tapered sidewalls and/or texturing, for light extraction purposes. The amount of tapering and/or texturing may be related to the total thickness of the LED, including the growth substrate. The geometry of the substrate (e.g., thickness/sidewall bevels) and/or the texturing thereof may be adjusted to achieve desired far-field emission patterns. Moreover, since the substrate need not conduct current, it can have high resistivity so that it can be transparent.

LED chips according to various embodiments may be more rugged or robust than conventional LED chips. In particular, the only exposed surfaces of the LED chip may be solid p- or n-contact portions on one side, and the growth substrate on the other side. In contrast, conventional LED chips may need fragile wire bonds and may include exposed top and/or bottom portions of the LED epi.

Moreover, it has also been found, according to various embodiments, that the provision of a transparent insulating layer between the diode region and the reflective cathode contact may actually enhance the reflectivity from the diode region by providing an index mismatch or index step. Accordingly, as shown, for example, in FIG. 1, the transparent insulating layer 140 can provide an integral optical element for the reflective cathode contact 150, in addition to providing desired electrical insulation for the LED. Moreover, the transparent insulating layer 140 and the reflective cathode contact 150 can provide a hybrid mirror.

An explanation of the operation of the transparent insulating layer 140 as part of a hybrid reflector will now be provided. In particular, LEDs typically include multiple layers of different materials. As a result, light emitted from the active region must typically pass through or across one or more of such layers before exiting the LED. Snell's law dictates that the photons will be refracted as they pass from one material to the next. The angles at which the photons will be refracted will depend upon the difference between the refractive indexes of the two materials and the angle of incidence at which the light strikes the interface.

In an LED, although some reflected light will still escape the LED at some other location, a certain percentage will be totally internally reflected, never escape the LED, and will thus functionally reduce the external efficiency of the LED. Although the individual reduction in the percentage of photons escaping may appear to be relatively small, the cumulative effect can be significant, and LEDs that are otherwise very similar can have distinctly different performance efficiencies resulting from even these small percentage losses.

Snell's law dictates that when light crosses an interface into a medium with a higher refractive index, the light bends towards the normal. Similarly, when light travels across an interface from a medium with a high refractive index to a medium with a lower refractive index, light bends away from the normal. At an angle defined as the critical angle, light traveling from a medium with a high refractive index to a medium with a lower refractive index will be refracted at an angle of 90°; i.e., parallel to the boundary. At any angle greater than the critical angle, an incident ray undergoes total internal reflection (TIR). The critical angle is thus a function of the ratio of the refractive indexes. If the light hits the interface at any angle larger than this critical angle, the light will not pass through to the second medium at all. Instead, the interface reflects the light back into the first medium, a process known as total internal reflection. The loss of light due to this total internal reflection is known as the critical angle loss, and is another factor that reduces the external efficiency of the LED.

Embodiments of a hybrid mirror described herein use index mismatching to enhance total internal reflection (TIR) based on Snell's law. In order to enhance TIR, it is desired to provide a large index change to a lower refractive index material relative to the GaN-based diode region. Thus, any light outside the escape cone angle given by Snell's law is internally reflected back into the diode region, and can have essentially no loss. The reflective cathode contact 150 and/or a reflective anode contact can then be used to reflect the fraction of the light impinging thereon from an omnidirectional light source. Accordingly, both the transparent insulating layer 150 and the reflective cathode contact act as a hybrid reflector according to various embodiments to enhance reflection of light emerging from the diode region back into the diode region.

Other embodiments of the invention can provide a reflective layer for a vertical LED. Thus, light emitting diodes according to various embodiments may also comprise a diode region including therein an n-type layer and a p-type layer, and a contact for one of the n-type layer or the p-type layer. The contact may comprise a transparent insulating layer 140 on the one of the n-type layer or the p-type layer that has an index of refraction that is less than the one of the n-type layer or the p-type layer. A reflective layer 150 is provided that electrically contacts the one of the n-type layer or the p-type layer, and that extends on the transparent insulating layer.

Accordingly, the transparent insulating layer 140 can provide an integral optical element for a reflective layer 150 so as to provide a hybrid mirror that can improve the reflectivity of the reflective layer 150 compared to absence of the transparent insulating layer 140, because the transparent insulating layer provides an index mismatch or index step to the diode region 110. In other embodiments, the reflective layer 150 can also electrically contact, and in some embodiments ohmically contact, the one of the n-type layer or the p-type layer, and may extend through the transparent insulating layer 140 to make this contact. In still other embodiments, a second contact may be provided for the other of the n-type layer or the p-type layer. The second contact may comprise a second reflective layer that ohmically contacts the other of the n-type layer or the p-type layer. In other embodiments, the second contact may comprise a transparent conductive layer that ohmically contacts the other of the n-type layer or the p-type layer, and the transparent insulating layer 140 and the reflective layer 150 can both extend onto the transparent conductive layer. These other embodiments will be described in detail below, for example in connection with FIGS. 2 and 3.

Moreover, various embodiments as described herein can also provide a diode region 110 having first and second opposing faces 110a, 110b, and including therein an n-type layer 112 and a p-type layer 114. A reflective anode contact 130 ohmically contacts the p-type layer and extends on the first face 110a. A reflective cathode contact 150 ohmically contacts the n-type layer and extends on the first face. The reflective anode contact 130 and the reflective cathode contact 150 are configured to reflect substantially all light that emerges from the first face 110a back into the first face 110a. Stated differently, the reflective cathode contact 150 can cover substantially all of the first face 110a that is outside the anode contact 130. Moreover, in other embodiments, the reflective cathode contact 150 can also cover at least a portion of the anode contact 130.

Figure 2:
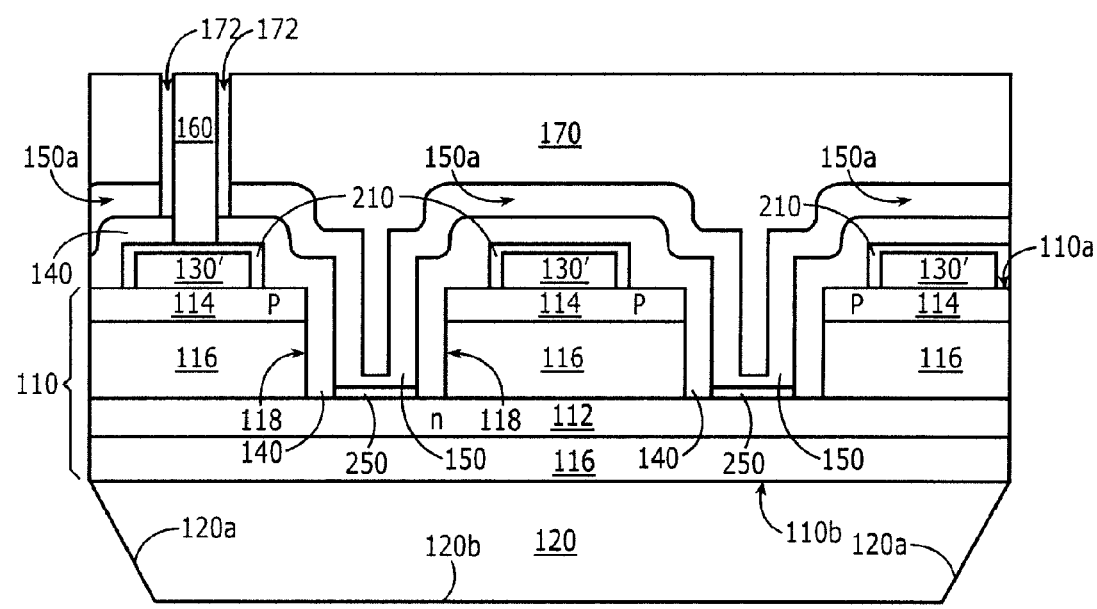

FIG. 2 is a cross-sectional view of an LED according to other embodiments. In these embodiments, a reflective anode contact is provided in addition to a reflective cathode contact.

More specifically, in FIG. 2, a diode region 110 is provided as was described in connection with FIG. 1. A substrate 120 is also provided, although it need not be provided in other embodiments. The substrate 120 may be thinned relative to the thickness of the growth substrate. A reflective anode contact 130' is provided that ohmically contacts the p-type layer 114 and extends on the first face 110a. The reflective anode contact 130' may include a two-layer structure including, for example, about 5 Å of nickel (Ni) directly on the p-type layer 114 and about 1000 Å of silver (Ag) on the nickel, to thereby provide an "NiAg mirror" 130'. The NiAg mirror 130' can reflect at least 90% of the visible light from the diode region 110 that impinges thereon. Other reflective layers that also provide an ohmic contact to p-type gallium nitride may be used in other embodiments. It will be understood that the reflectivity of the NiAg mirror is determined primarily by the Ag because only a very thin layer (in some embodiments less than about 10 Å) of Ni is used. Moreover, when annealed, this nickel may convert to nickel oxide to enhance the ohmic contact for the Ag to the p-type gallium nitride. Thus, the NiAg mirror 130' can have about the same reflectivity of Ag alone, but can provide a better contact and lower voltage to the p-type layer. In other embodiments, pure Ag may be used.

Surrounding the NiAg mirror 130' is a barrier layer 210 which may include sublayers comprising about 1000 Å of titanium tungsten (TiW), about 500 Å of platinum (Pt) and about 1000 Å of titanium tungsten (TiW). The titanium tungsten/platinum sublayers may repeat in multiple repetitions to provide a desired diffusion barrier. The diffusion barrier layer 210 generally is not reflective. Thus, the face of the NiAg mirror 130' that is directly on the p-type layer 114 provides a reflective structure, but the barrier layer 210 that is on the sidewall of the NiAg mirror 130' may not provide a reflective structure.

Continuing with the description of FIG. 2, a transparent insulating layer 140 is provided on the sidewalls of the via 118 and on the first face 110a outside the via 118. In some embodiments, as shown, the transparent insulating layer 140 may also extend onto at least a portion of the NiAg mirror 130'. In some embodiments, the transparent insulating layer 140 may comprise about 0.5 μm of silicon dioxide ($SiO_2$). The thickness of the $SiO_2$ may be configured to enhance the reflectivity from the reflective cathode contact 150, based on the operating wavelength of the LED and/or the index of refraction of the insulating layer, using techniques known to those skilled in the art. In particular, the silicon dioxide may have an index of refraction of about 1.5, which is less than the index of refraction of gallium nitride (about 2.5), so that an index mismatch or index step is provided by the transparent insulating layer 140, which can actually enhance TIR from the diode region 110.

As also shown in FIG. 2, the reflective cathode contact 150 can ohmically contact the n-type layer 112, for example on the floor of the via 118 and can extend on the transparent insulating layer 140 on the sidewall of the via 118, and may also extend onto the transparent insulating layer 140 that is outside the via 118 as indicated by 150a. In some embodiments, the reflective cathode contact 150 may comprise about 1500 Å of aluminum. Thicker reflective cathode contacts also may be used. The hybrid reflector that includes the transparent insulating layer 140 and the aluminum reflective cathode contact 150 can reflect at least 90% of the visible light from the diode region 110 that impinges thereon. In other embodiments, a separate ohmic contact layer 250 may be provided between the reflective cathode contact 150 and the n-type layer 112, to provide an ohmic contact to the n-type layer 112. In some embodiments, the ohmic contact layer 250 may comprise titanium, for example annealed titanium, or aluminum/titanium alloy It will be understood that the ohmic contact layer 250 may be used in any and all of the embodiments described herein between the reflective contact 150 and the n-type or p-type layer.

Finally, an anode pad 160 and a cathode pad 170 are provided. The anode pad 160 and the cathode pad 170 can include a stack of about 500 Å titanium (Ti), about 2000 Å nickel (Ni) and about 1-3 μm of 80/20 gold-tin (AuSn) alloy, to provide "TiNiAuSn pads". Other materials may be used, and not all of these layers may be used. For example, pure tin may be used as it has a lower melting point. Moreover, in other embodiments, a plating seed layer may be provided on the anode contact and on the reflective cathode contact, and at least a portion of the anode and/or cathode pads are plated on the seed layer. In still other embodiments, the reflective cathode contact 150 and/or the barrier layer 140 may provide the plating seed layer for plating the pads 160/170 thereon. The plated anode and cathode pads can also provide mechanical support and enhanced thermal efficiency.

Accordingly, embodiments of FIG. 2 may provide a reflective structure on the first face 110a that is configured to reflect substantially all light, for example, at least 90% of the light that emerges from the first face 110a back into the first face 110a. In embodiments of FIG. 2, the reflective structure comprises two different reflectors. More specifically, the reflective structure comprises a reflective surface of the anode contact 130' that ohmically contacts the p-type layer 114, a reflective surface of the cathode contact 150 that ohmically contacts the n-type layer 118 and a reflective surface of extensions 150a of the cathode contact 150 that extend between the reflective surface of the anode contact 130' that ohmically contacts the p-type layer 114 and the reflective surface of the cathode contact 150 that ohmically contacts the n-type layer 118, in combination with the transparent insulating layer 140. When viewed from the perspective of the diode region 110, all the light that emerges from the diode region 110 into the anode and cathode contacts can be reflected back into the diode region except for light that is absorbed by the barrier layer 210 on the sidewalls of the anode contact 130. Since the barrier layer 210 generally does not form an ohmic contact with the p-type layer 114, little or no light is generated in this region. Thus, there can be little or no light loss associated with the barrier layer 210. Thus, from an area standpoint, the reflective structure of FIG. 2 can reflect the light that emerges from at least 85% of the area of the first face, and in some embodiments, at least 90% of the area. In other words, at least 90% of the diode face can be covered by mirror. Moreover, since the reflective structure can comprise nickel-silver (anode contact 130') and aluminum (cathode contact 150), at least 90% of the light that impinges on the reflective structure may be reflected. In other words, the mirror may have at least 90% efficiency. Thus, in some embodiments, the only regions in the active light generating area on the p-type layer 114 not covered by high reflectivity structures either have a dielectric contact, and/or are reduced conductivity regions.

Figure 3:
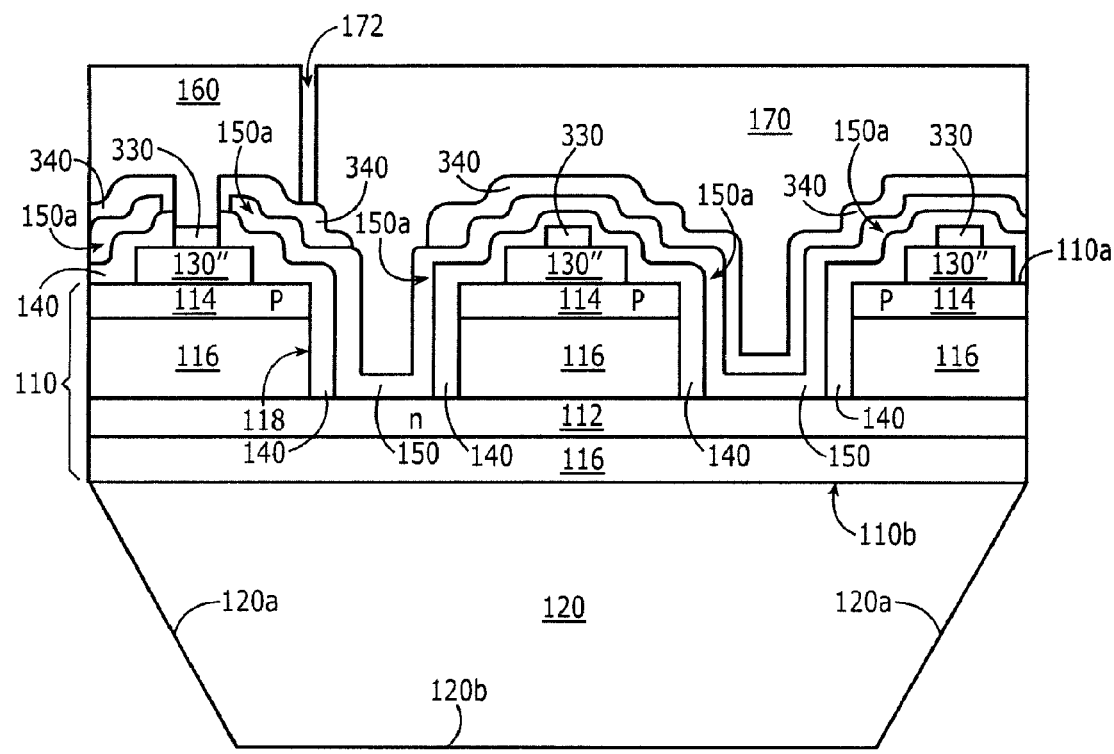

FIG. 3 is a cross-sectional view of other embodiments that employ a transparent anode contact. In particular, referring to FIG. 3, the anode contact is a transparent anode contact 130" that ohmically contacts the p-type layer 114 and extends on the first face 110a. It will be understood that the transparent anode contact 130" may extend to a greater or lesser extent than illustrated. In some embodiments, the transparent ohmic contact for the p-type Group III-nitride layer 114 may be a transparent conductive oxide, such as indium tin oxide (ITO) and, in some embodiments, may be about 2500 Å thick. The ITO may be at least 90% transparent in the wavelengths of interest. It will be understood that the ITO may include other materials therein, such as nickel or aluminum. A current spreading layer 330, also referred to as "current spreading fingers", may be provided on a portion of the transparent anode contact 130". The current spreading layer 330 may comprise, for example, a sublayer of platinum (Pt) about 500 Å thick, a sublayer of titanium (Ti) about 500 Å thick and a sublayer of gold (Au) about 0.5 μm thick, to provide a "Pt/Ti/Au" current spreading layer 330.

In embodiments of FIG. 3, the transparent insulating layer 140 extends onto the transparent anode contact 130" and the reflective cathode contact 150 also extends onto the transparent insulating layer 140 that is on the transparent anode contact 130" as shown by 150a. In some embodiments, as also shown in FIG. 3, the transparent insulating layer 140 extends onto the transparent anode contact 130" that is outside the portion on which the current spreading layer 330 is provided, and the reflective cathode contact 150 also extends onto the transparent insulating layer 140 that is on the transparent anode contact 130" outside this portion. Thus, an integrated n-contact hybrid mirror is provided that reflects light that passes through the transparent anode contact 130" back into the diode region 110. It will also be understood that in embodiments of FIG. 3, the ohmic contact layer 250 has been omitted, so that reflective cathode contact 150 makes direct ohmic contact with the n-type layer 112.

Accordingly, embodiments of FIG. 3 can provide a reflective structure that comprises a reflective surface of the cathode contact 150 that ohmically contacts the n-type layer 112 and a reflective surface of an extension 150a of the cathode contact 150 that extends onto the transparent anode contact 130", in combination with the transparent insulating layer 140. From a total internal reflection standpoint, since the transparent anode contact 130" also has a lower index of refraction than the diode region (index of refraction of about 1.94 for ITO), the index mismatch enhances TIR based on Snell's law. The transparent insulating layer 140 that is on the transparent anode contact 130" can further enhance TIR by providing an even lower index of refraction of about 1.5.

Thus, from the standpoint of reflection from the diode region 110, only the current spreading layer 330 may absorb light. Since the current spreading layer is a small portion of the surface area of the first face, embodiments of FIG. 3 may also provide a reflective structure that reflects light that emerges from at least 90% of the area of the first face, and in some embodiments, from at least 93% of the area of the first face. In other words, at least 90% of the diode face is covered by mirror. Moreover, the mirror may have at least 90% efficiency. It will also be understood that the current spreading layer 330 on the transparent anode contact 130" may be less absorbing than the current spreading layer 330 alone. In particular, due to the index of refraction change at the ITO/GaN interface, the current spreading layer 330 may be less absorbing on an angle average basis than the current spreading layer 330 alone. This provides an additional benefit to using ITO as the N—GaN contact so that a metallic layer is not directly on the semiconductor.

The potentially negative impact of the current spreading layer may also be reduced by reducing the light hitting the metal current spreading layer by quenching the p-GaN under the current spreading layer 330 so that the light hitting that area mostly comes from an angle that is outside the region directly under the current spreading layer 330. Thus, some embodiments can also incorporate a reduced conductivity region in a p-type layer that are congruent with nearby more opaque features, such as the current spreading layer, as described in U.S. Patent Application Publication No. 2008/0217635, the disclosure of which is hereby incorporated by reference in its entirety as if set forth fully herein.

Still referring to FIG. 3, an insulating layer 340, such as a second layer of silicon dioxide about 0.5 μm thick, may be provided on the reflective cathode contact 150. An anode pad 160 and a cathode pad 170 may be provided to electrically connect to the current spreading layer 330 and the reflective cathode contact 150, respectively. In embodiments of FIG. 3, the insulating layer 340 may prevent the anode and cathode contact pads 160 and 170 from short circuiting one another. In other embodiments, however, the anode 160 and cathode 170 pads may be formed directly on the current spreading layer 330 and directly on the reflective cathode contact 150, and may be spaced apart so as to provide a gap 172 therebetween, as was illustrated in FIG. 2, and as will be described below in embodiments of FIG. 10. Many other configurations of anode pads 160 and cathode pads 170 may be provided in other embodiments.

Figure 4:
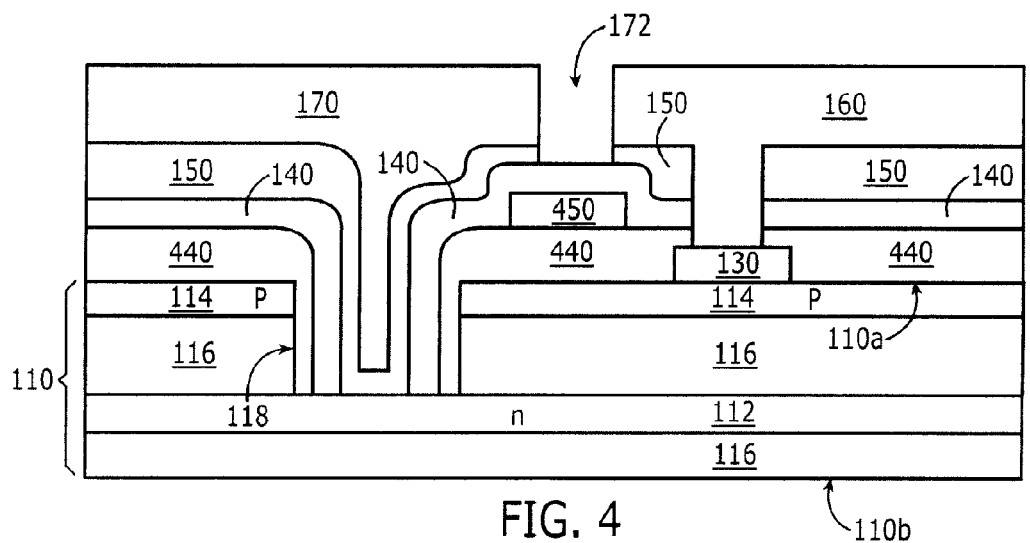

FIG. 4 is a cross-sectional view of LEDs according to other embodiments. In particular, as was noted above, various configurations of anode pads 160 and cathode pads 170 may be provided according to various embodiments. In some of these configurations, a break in the reflective cathode contact 150 may be desired, as shown in FIG. 4, so as to prevent short circuiting of the anode pad to the contact pad 170, and leave a gap 172 therebetween. Unfortunately, due to the absence of the reflective cathode contact 150 in the gap, light in the gap may not be reflected back into the diode region 110. Embodiments of FIG. 4 can reduce or eliminate this problem by providing a reflective layer 450 that is insulated from the anode pad 160 and/or the cathode pad 170, and that extends across the gap 172. An additional (second) insulating layer 440 may be provided to also insulate this reflective layer 450 from the diode region 110, if needed. Accordingly, a reflective layer 450 may be provided in the gap 172, even though reflective cathode contact 150 has a break across the gap 172.

Figure 5A:
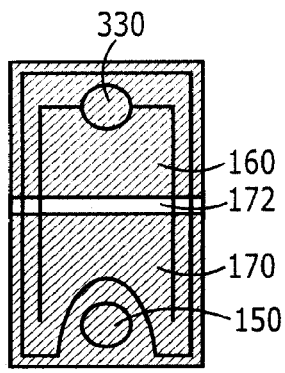
FIGS. 5A-5B are top views of light emitting diodes according to various embodiments.
Figure 5B:
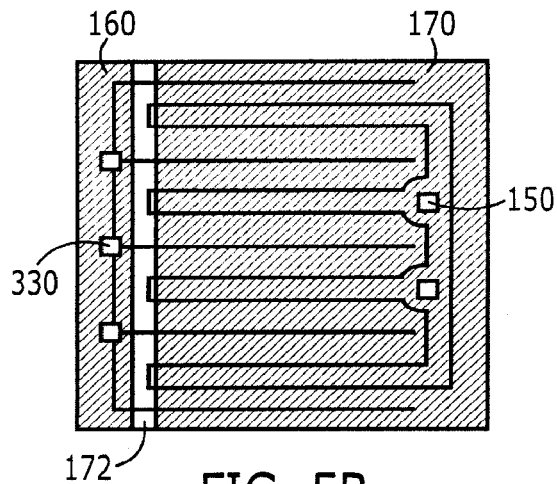

FIGS. 5A and 5B are top views of anode pads 160 and cathode pads 170 according to various embodiments. It will be understood, however, that many different configurations of anode pads 160 and cathode pads 170 may be provided, depending on the desired external connections for the lateral LED.

Figure 6:
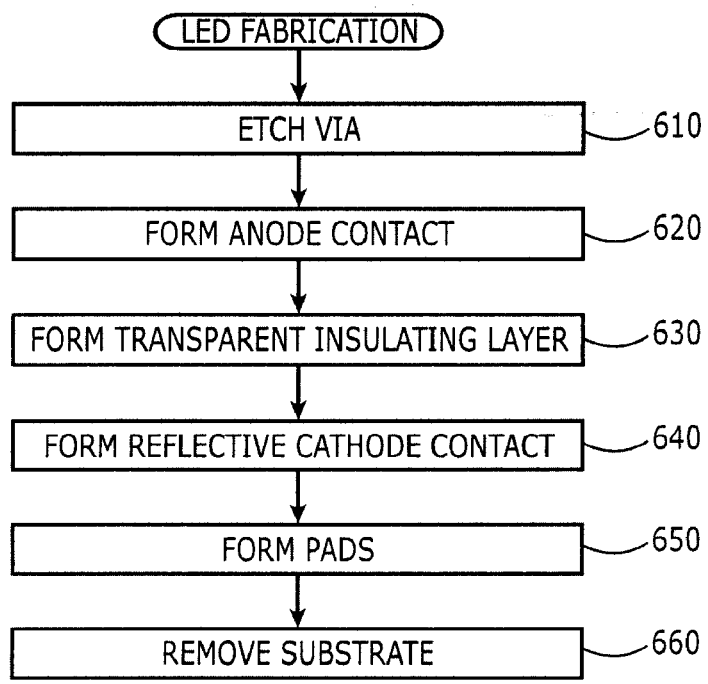
FIG. 6 is a flowchart of operations that may be performed to fabricate light emitting diodes according to various embodiments.

FIG. 6 is a flowchart of operations that may be performed to fabricate light emitting diodes according to various embodiments. In particular, at Block 610, a via, such as via 118, is etched through a p-type layer, such as a p-type layer 114, at a first face of a diode region, such as a diode region 110, to expose an n-type layer, such as an n-type layer 112, therein. At Block 620, an anode contact, such as an anode contact 130, 130' and/or 130", is formed on the first face that ohmically contacts the p-type layer. At Block 630, a transparent insulating layer, such as layer 140, is formed on the sidewalls of the via and extending on to the first face outside the via. At Block 640, a reflective cathode contact, such as a reflective cathode contact 150, is formed, that ohmically contacts the n-type layer on a floor of the via and extends on the transparent layer that is on the sidewalls of the via, and on the transparent layer that is on the first face outside the via. Pads, such as anode pad 160 and cathode pad 170, may be formed at Block 650. Finally, if desired, the substrate may be removed or thinned at Block 660. The substrate and/or the second face may be textured.

Embodiments of FIG. 6 may be generally used to fabricate various embodiments described herein. Specific techniques may also be provided to fabricate specific embodiments. For example, embodiments of FIG. 3 may be fabricated by etching the via 118 to expose the n-type layer 112 at Block 610. A layer of indium tin oxide 130' and a current spreading layer 330 may then be formed at Block 620. A layer of silicon dioxide, such as 0.5 μm of silicon dioxide, may be blanket deposited to provide the transparent insulating layer 140 at Block 630. A via may be etched to expose the n-type layer 112 and aluminum may be blanket deposited to provide the reflective cathode contact 150, leaving a gap over the ITO layer 130", at Block 640. TiNiAuSn pads 160 and 170 may be deposited at Block 650. Other techniques may be used to fabricate other structures according to various embodiments.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated.

Figure 7A:
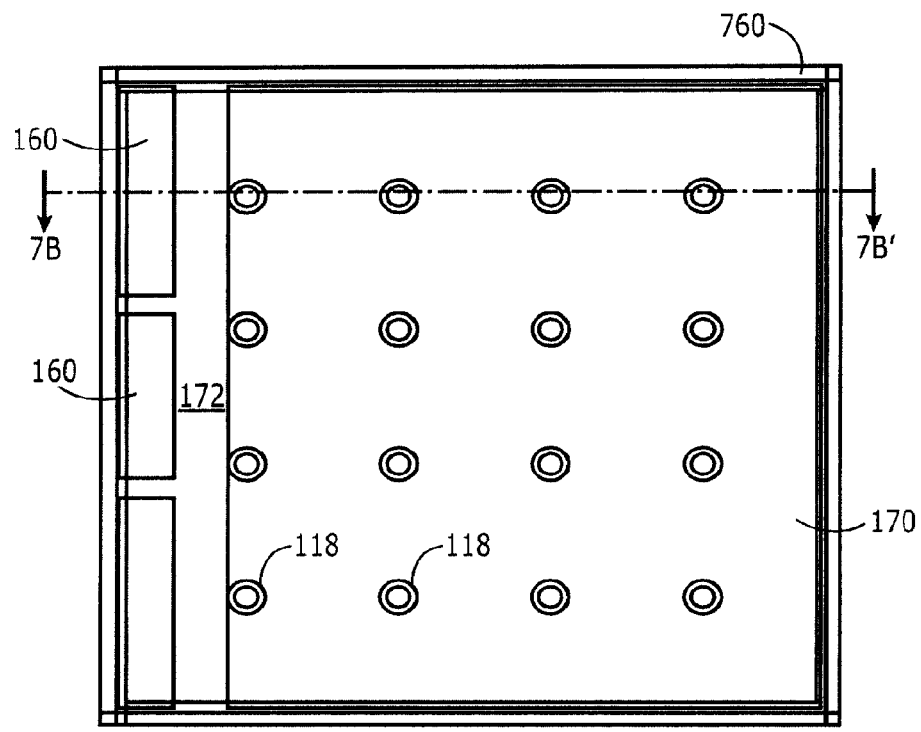
FIG. 7A is a top view and FIG. 7B is a cross-sectional view along line 7B-7B' of FIG. 7A, of a light emitting diode according to various other embodiments.
Figure 7B:
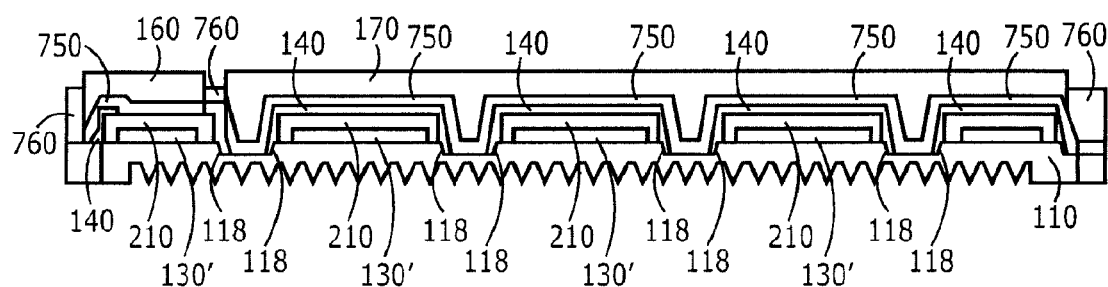

FIGS. 7A and 7B are top and side cross-sectional views, respectively, of LEDs according to still other embodiments. These embodiments may be similar to embodiments of FIG. 2, except that a reflective seed layer 750 is provided on the barrier layer 210 and is used as a plating seed for plating the anode pad 160 and the cathode pad 170 thereon. Moreover, the ohmic cathode contact may be provided by a portion of the seed layer that directly contacts the diode region 110 according to any of the above-described embodiments. In these embodiments, the reflective seed layer 750 may comprise successive layers of aluminum, titanium and copper, while the pads 160 and 170 may comprise plated copper.

More specifically, embodiments of FIGS. 7A and 7B may be fabricated by fabricating the NiAg mirror 130' to provide a p-type anode contact and by fabricating a barrier region 210 on the NiAg mirror 130', as was described in connection with FIG. 2. The diode region 110 is then etched to reach the n-type layer 112 (not illustrated in FIG. 7A or 7B), and to also define the vias. A passivation layer 140 may then be deposited and etched to expose the n-type region on the floor of the via 118 and a portion of the barrier 210. A seed layer 750 may then be deposited, contacting the n-type region and the barrier. The anode pad 160 and cathode pad 170 are then plated on the seed layer 750 with a photo-lithographically defined gap 172 (for example about 75 μm wide) between the anode and cathode pads. The portion of the seed layer 750 in the gap 172 may then be etched such the extent of the remaining seed layer is essentially the same as that of the anode pad and cathode pad. The gap 172 may then be filled with a gap filling layer 760, which may comprise polyimide, for example. The silicon carbide substrate is then removed to produce the final structure of FIG. 7B.

Accordingly, embodiments of FIGS. 7A and 7B can provide an LED having reflective anode contacts 130', so that the entire surface is reflective except for where the barriers 210 on are directly on the diode region 110. Thus, in embodiments of FIG. 7A, the entire structure has a mirror, except for the region immediately surrounding where the 16 vias 118 are. Moreover, in other embodiments, the seed layer 750 may comprise a non-reflective metal (for example, to provide improved ohmic contact to the n-type layer 112) with only a small impact on the overall mirror reflectivity since the light sees the seed layer only where the 16 vias 118 are.

Figure 8A:
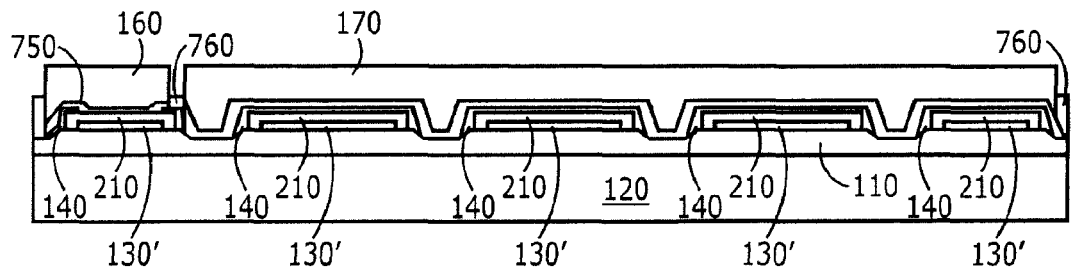
FIGS. 8A-8C are cross-sectional views of light emitting diodes of FIGS. 7A and 7B during intermediate fabrication steps according to other embodiments.
Figure 8B:
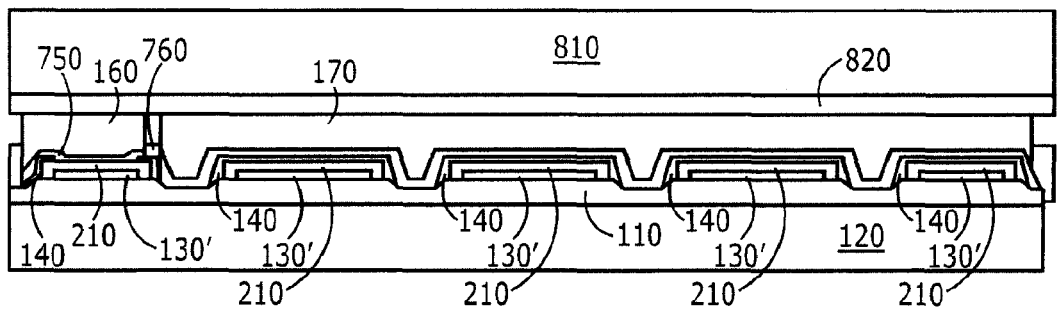
Figure 8C:
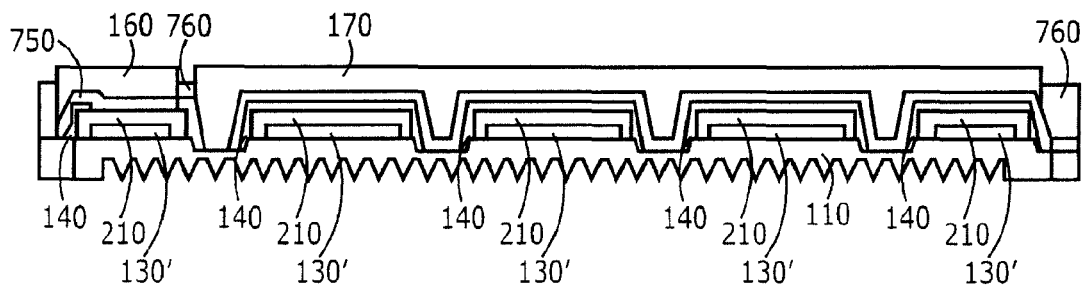

FIGS. 8A-8C are cross-sectional views of operations that may be performed to remove the substrate 120 according to various embodiments. As shown in FIG. 8A, operations to fabricate the LED as were described in connection with FIG. 7B may be performed on an LED epi 110 that is on a growth substrate 120. As shown in FIG. 8B, a carrier wafer 810, which may be semiconductor, glass and/or other conventional carrier wafer, is bonded to the plated anode pad 160 and cathode pad 170 using a glue 820 or other bonding material/technique. In FIG. 8C, the substrate 820 is removed, and the outer face of the diode region 110 is textured to provide the structure of FIG. 7B.

Figure 9:
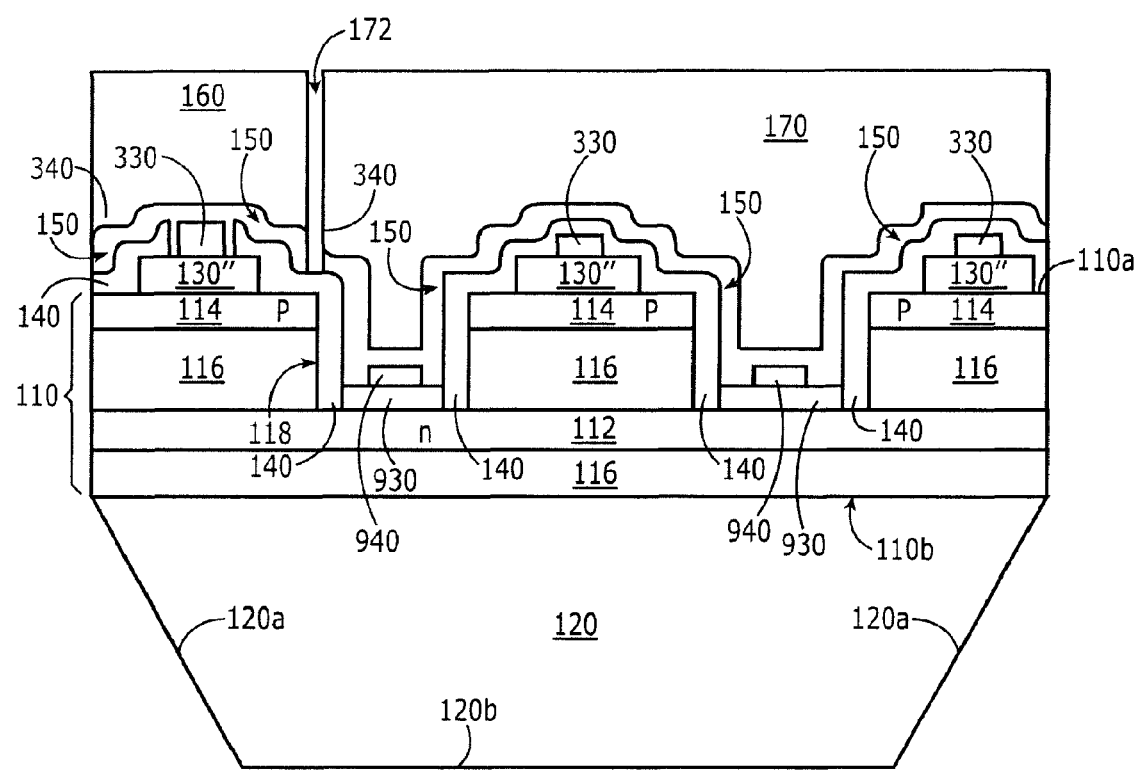
FIG. 9 is a cross-sectional view of a light emitting diode according to yet other embodiments.

FIG. 9 is a cross-sectional view of a light emitting diode according to yet other embodiments. In FIG. 9, a first transparent anode contact 130" and a current spreading layer 330 are provided, as was described in connection with FIG. 3. However, in embodiments of FIG. 9, a transparent cathode contact 930 and current spreading layer 940 also may be provided. The transparent cathode contact 930 ohmically contacts the n-type layer 112 and extends on the first face 110a. The extent of the transparent anode contact 130' and the transparent cathode contact 930 may be more or less than that illustrated in FIG. 9. Moreover, the transparent cathode contact 930 may comprise the same material as the transparent anode contact 130". For example, indium tin oxide may be used. In other embodiments, however, different transparent materials may be used for the contacts 130" and 930. In still other embodiments, the same material may be used but may be deposited using different techniques and/or operating parameters. Similarly, the two current spreading layers 330, 940, may be the same or different materials and may be fabricated using the same or different processes.

Still referring to FIG. 9, a transparent insulating layer 140 is provided that extends on the first face including on the transparent anode contact 130" and on the transparent cathode contact 930. A reflective layer 150 is provided on the transparent insulating layer that substantially covers the first face 110. The current spreading layer 330 may be provided between the transparent anode contact 130" and the reflective layer 150, and the current spreading layer 940 may be provided between the transparent cathode contact 930 and the reflective layer 150. As was already described, the current spreading layers 330, 940 may be different portions of the same layer. As also illustrated in FIG. 9, the reflective layer 150 may comprise first and second portions of a layer that are connected to the respective current spreading layers 330, 940.

Embodiments of FIG. 9 may provide a reflective layer 150 that substantially covers the first face. Moreover, efficient light extraction may be provided because the transparent anode contact 130" and the transparent cathode contact 930 may both comprise ITO that has an index of refraction of about 1.9 and the transparent insulating layer 140 may comprise a material, such as silicon dioxide that has an index of refraction of about 1.5, which is lower than ITO. Moreover, when the diode region 110 is formed by Group III-nitrides, such as gallium nitride, having an index of refraction of about 2.5, the transparent ITO layer 130", 940 and the transparent insulating layer 140 may provide an index mismatch or index step with the gallium nitride. Enhanced total internal reflection may thereby be provided by the stepped index hybrid reflector compared to absence of the transparent insulating layer 140 and the transparent ITO layers 130', 940. Furthermore, the transparent substrate 120 may comprise transparent silicon carbide, which has an index of refraction of about 2.6. Since the silicon carbide substrate 120 need not be conducting, it may be of high resistivity and be transparent. Moreover, since the silicon carbide substrate 120 is index matched to the gallium nitride diode region 110 (i.e., about the same index of refraction), enhanced light extraction may be provided through the beveled sidewalls 120a of the silicon carbide substrate. Thus, the transparent silicon carbide substrate 120 can function as a light extractor, as well as a mechanical and/or thermal substrate for the LED.

Finally, referring to FIG. 9, when the transparent anode contact and the transparent cathode contact both comprise transparent conductive metal oxide, such as ITO, and the reflective layer 150 comprises an elemental metal layer, such as aluminum, the first face 110 can be free of direct contact with elemental metal, whereas an elemental metal reflector 150 can substantially cover the first face.

FIGS. 10A-10D and 10A'-10D' are cross-sectional views and top plan views, respectively, of light emitting diodes according to yet other embodiments during intermediate fabrication steps according to yet other embodiments. These embodiments may only use one insulating layer, compared to embodiments of FIG. 3.

Figure 10A:
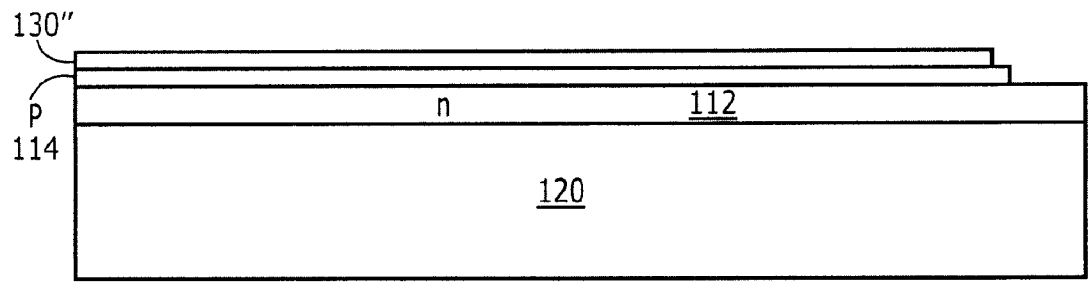
FIGS. 10A-10D and 10A'-10D' are cross-sectional and top plan views, respectively, of light emitting diodes according to various embodiments during fabrication according to various embodiments.
Figure 10A:
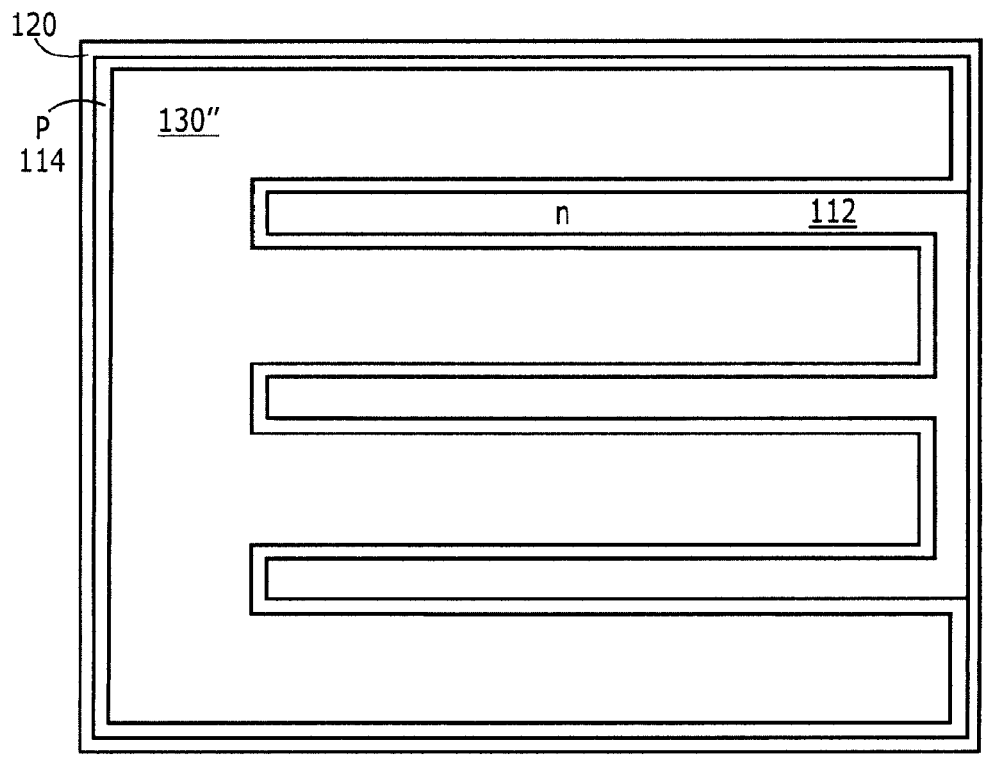

Referring to FIGS. 10A and 10A', the diode region 110 including the n-type layer 112 and p-type layer 114 are formed on a substrate 120. A p-type ohmic contact is then formed. In FIGS. 10A and 10A', a transparent p-type ohmic contact comprising ITO 130" is formed. In other embodiments, a metal mirror/ohmic contact such as NiAg may be formed. In this case, a barrier layer also may be formed, as was described above, to reduce or prevent silver migration.

Figure 10B:
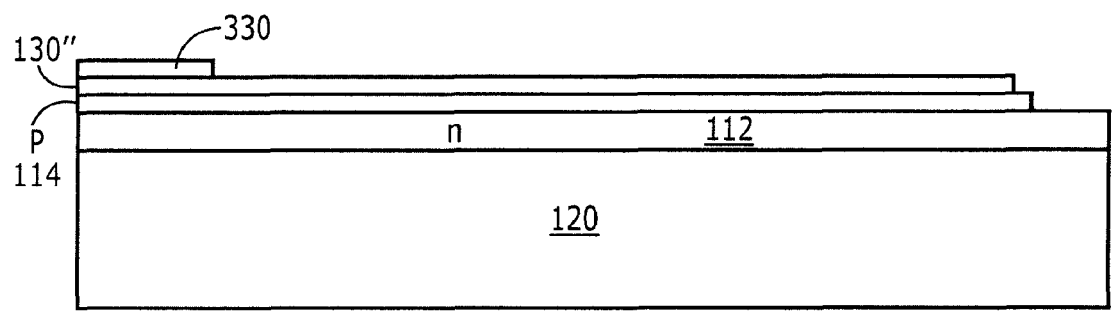
Figure 10B:
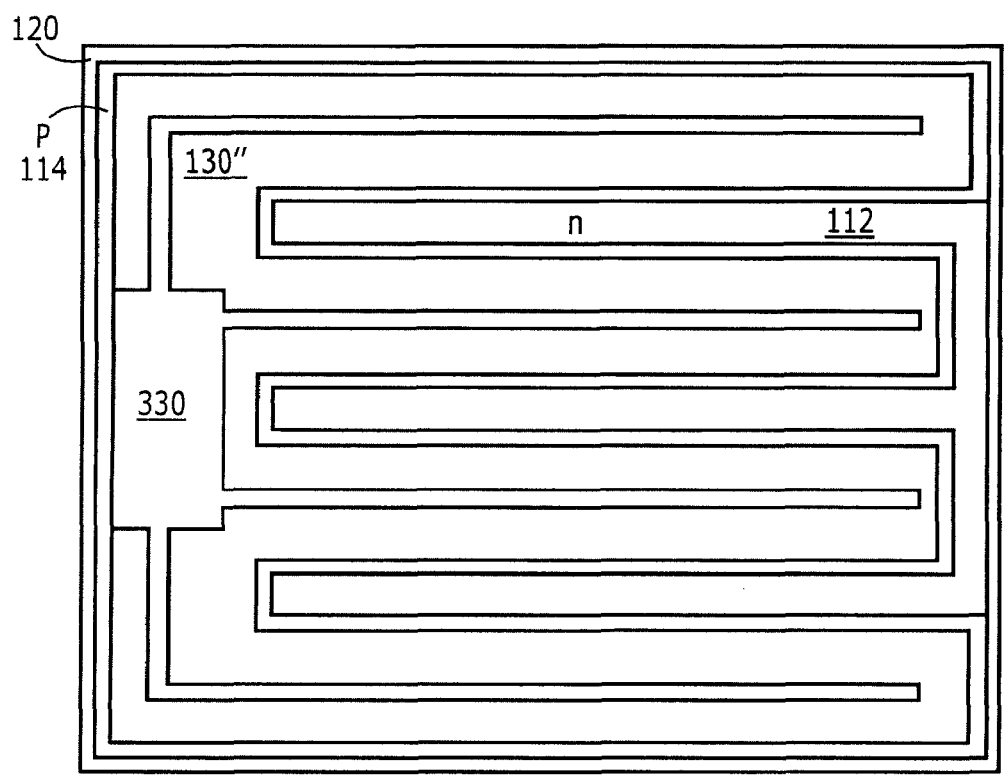

Referring now to FIGS. 10B and 10B', a p-current spreading layer 330 is then formed when an ITO-type contact is used.

Figure 10C:
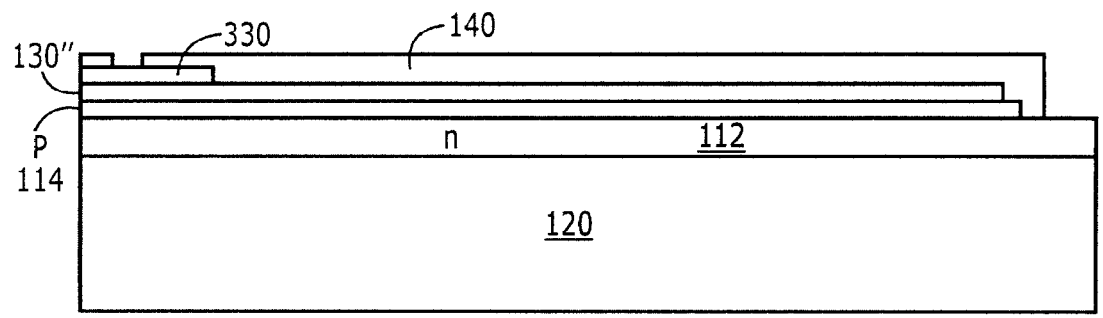
Figure 10C:
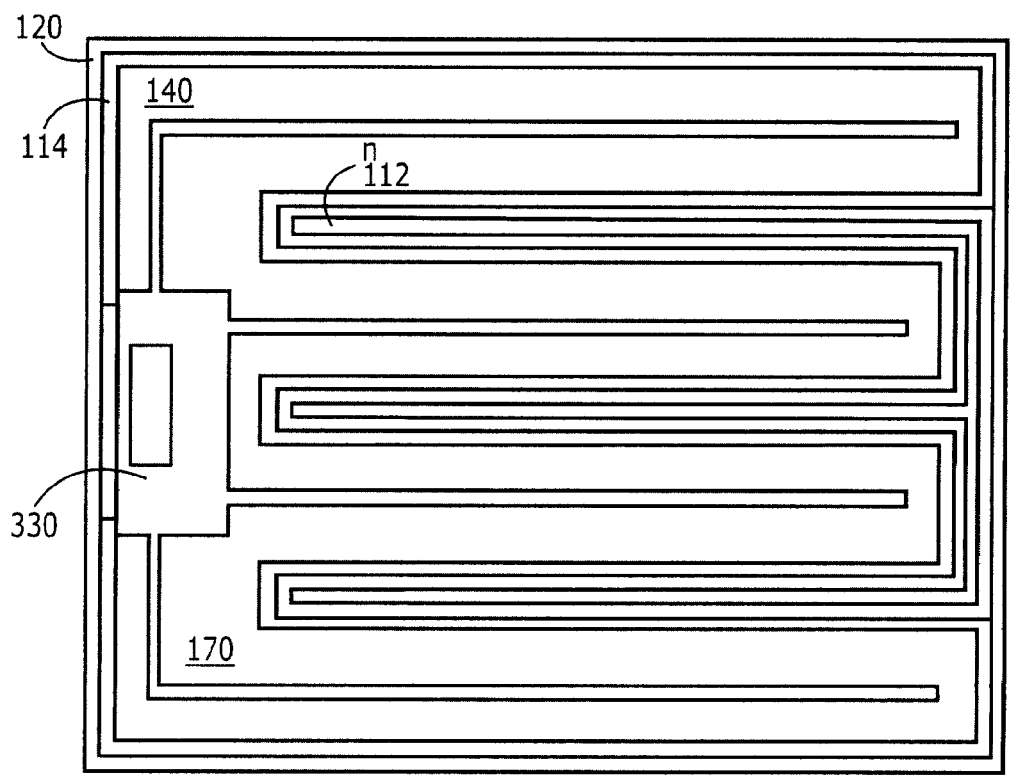

Referring now to FIGS. 10C and 10C', silicon dioxide or another transparent insulating layer or combination of layers 140 is blanket deposited, and then vias are opened to the n-type layer 112 and to the current spreading layer 330.

Figure 10D:
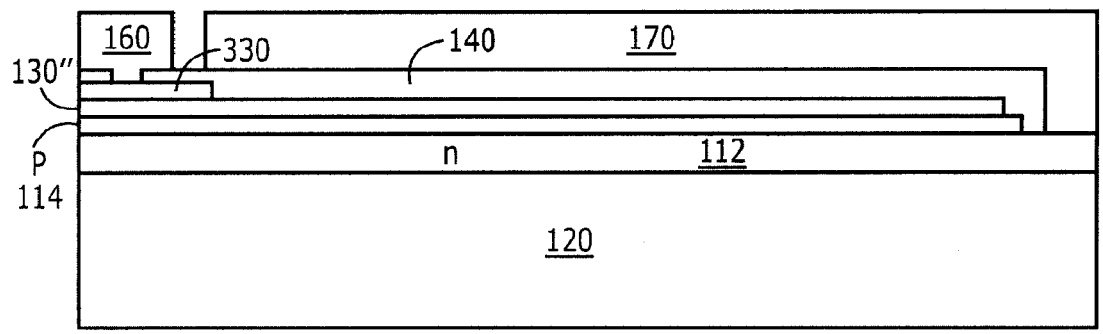
Figure 10D:
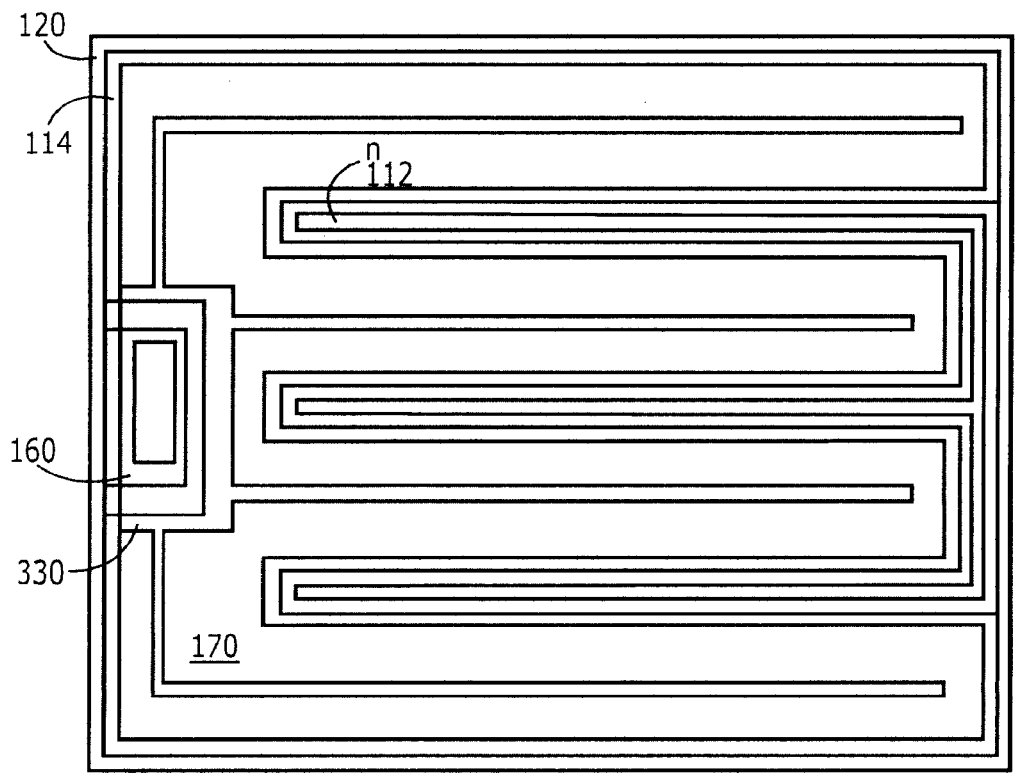

Finally, referring to FIGS. 10D and 10D', a layer of Al/Ti/Ni/AuSn is deposited to form the anode and cathode contacts 160 and 170, respectively. It will be understood that it may be desirable for the titanium and nickel layers to be appropriately thick to reduce or prevent mixing during reflow. Thicknesses of approximately 1000 Å titanium and 1000 Å nickel may be used, in some embodiments. Moreover, gold tin may not be needed. Rather, the contact stack may be terminated by gold to facilitate other solder attachment.

Figure 11:
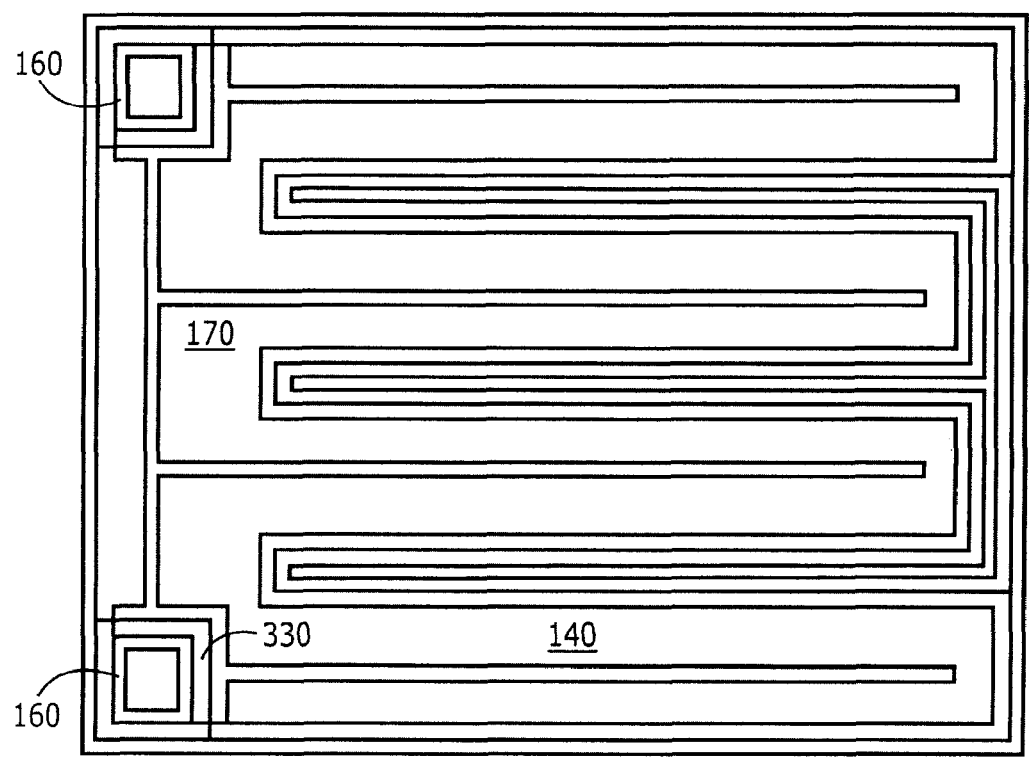
FIG. 11 is a plan view of an alternate embodiment of FIG. 10D'

It will also be understood that, although one embodiment of a contact geometry illustrated in FIGS. 10D, 10D', other contact geometries may be provided, as shown in FIG. 11. Yet other contact geometries may be provided based on desired external connections.

Figure 12:
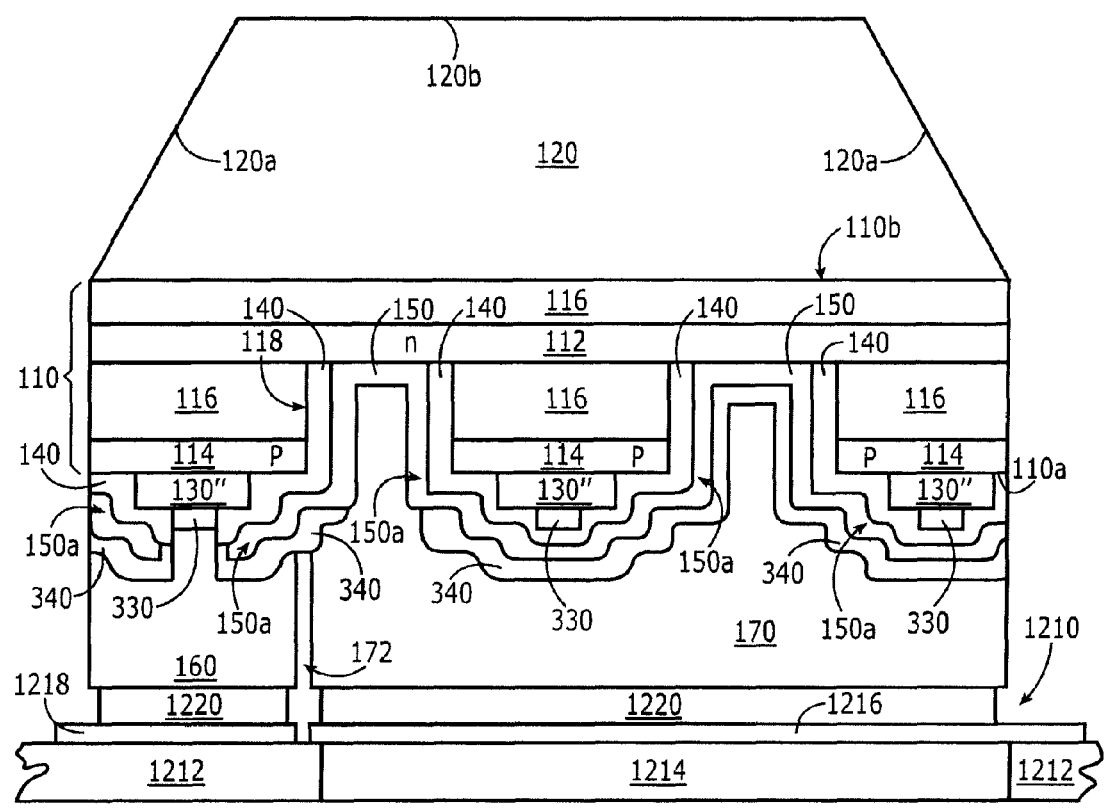
FIG. 12 is a cross-sectional view of a light emitting diode according to embodiments of FIG. 3, mounted on a mounting substrate in a flip-chip configuration according to various embodiments.

FIG. 12 is a cross-sectional view of a light emitting diode of FIG. 3 mounted on a mounting substrate in a flip-chip configuration according to various embodiments. It will also be understood that any of the other embodiments described and/or illustrated herein may be mounted on a mounting substrate in a flip-chip configuration.

Referring now to FIG. 12, a mounting substrate 1210, such as an insulating mounting substrate comprising, for example, aluminum nitride (AlN), may be used to mount the LED of FIG. 3 thereon in a flip-chip configuration, such that the anode and cathode contacts 160 and 170 are adjacent the mounting substrate 1210 and the diode region 110 is remote from the mounting substrate 1210. Conductive traces 1216 and 1218 may be used to provide external connections for the diode. The conductive traces 1216, 1218 may be electrically and thermally connected to the contacts 160, 170 using solder or other die attach material 1220. Moreover, the area occupied by the cathode contact 170 may be enlarged, and in some embodiments maximized, whereas the area occupied by the anode contact 160 may be reduced, and in some embodiments minimized. By providing a large area for the cathode contact 170, the cathode contact 170 may be directly electrically coupled to a grounded copper slug 1214 or other heat sink material, to provide enhanced thermal efficiency for the package. The material 1212 should be electrically insulating to provide electrical isolation between the anode and cathode contacts 160, 170. An intervening electrically insulating layer that could reduce thermal efficiency is not needed.

In flip-chip mounting an LED as illustrated in FIG. 12, the provision of a reflective structure, such as the reflective cathode contact 150 that covers substantially the entire first face of the diode, and is configured to reflect substantially all light that emerges from the first face back into the first face, may be exceedingly beneficial. In particular, in a flip-chip configuration, light that is not reflected back towards the first face may be substantially lost, because the mounting substrate 1210 may be substantially absorbing. Accordingly, to enhance and/or maximize light emission through the substrate 120 in a flip-chip configuration, it may be desirable to increase or maximize the area of the first face that is covered by the mirror using various embodiments described herein.

It will also be understood that other forms of mounting substrates, such as metal core substrates, printed circuit boards, lead frames and/or other conventional mounting substrates, may be used to mount many of the embodiments described herein in a flip-chip configuration.

Additional discussion of various embodiments of the invention will now be provided. In particular, light emitting diodes according to some embodiments can provide a lateral flip-chip design. The substrate 120 can form the emitting face of the diode, and may include light extraction enhanced surfaces 120d that include lenticular lenses or other enhancement features. Moreover, the substrate 120 includes beveled side edges 120a. A reflective contact 150 can substantially cover the p-type layer. The reflector 150 can include multiple metal layers to increase the range of frequencies reflected.

Compared to conventional vertical LEDs, lateral embodiments described herein can provide contacts on the epitaxial layer that can be mated with metals that offer greater reflectivity, such as aluminum. Moreover, when transparent silicon carbide is used as a device substrate, its transparency can be defined by the resistivity range of the silicon carbide. Specifically, in most cases, silicon carbide crystals that contain fewer dopant atoms, and thus have a higher resistivity, will exhibit greater transparency than silicon carbide crystals with more dopant atoms and higher conductivity. Vertical devices generally use higher conductivity substrates. In vertical designs, the desired higher conductivity substrates tend to absorb more light and, thus, can reduce the external efficiency of the LED. Accordingly, many vertical designs may remove all or part of the silicon carbide substrate.

In sharp contrast, lateral designs according to various embodiments, do not require conductive substrates. As a result, these lateral designs can incorporate more transparent (i.e., high resistivity) silicon carbide substrates, while still demonstrating good forward voltage characteristics. For example, the resistivity of greater than 0.5 $\Omega$-cm, and in some embodiments greater than 1 $\Omega$-cm, may be provided. This contrasts with vertical designs that may use a resistivity of between about 0.08 $\Omega$-cm to about 0.2 $\Omega$-cm.

Various embodiments that were described herein can provide a reflective structure that is configured to reflect substantially all light that emerges from the diode region back into the diode region. Such a reflective structure may be extremely desirable for a flip-chip device, so as to reduce or prevent absorption of the emitted radiation by the mounting substrate. In particular, various technologies are known to reduce absorption of light into a bond pad. For example, it is known to provide reduced conductivity regions beneath a bond pad to reduce light emission into a bond pad. It is also known to reduce light emission into a bond pad by including an insulating layer beneath a portion of a transparent conductive bond pad. It is also know to use reflective bond pads, as described, for example, in U.S. Patent Application Publication 2007/0145380, to reflect light that strikes the bond pad.

Embodiments described herein can provide far more than a reflective bond pad or reduced emission into a bond pad. Rather, some embodiments described herein can provide a reflective structure on the first face of the diode region that can be configured to reflect substantially all light that emerges from the first face back into the first face. Accordingly, absorption by the mounting substrate can be reduced or minimized. In fact, in some embodiments, bond pad losses themselves may not be significant, because the LED itself can have high extraction efficiency by reducing multiple passes due to total internal reflection. Accordingly, various embodiments described herein can do much more than merely mitigate the insignificant light loss from the bond pads.

Lateral designs can also provide more options for positioning a desired mirror layer and the lateral design chips can be mounted with the epitaxial layers up or down. Specifically, the epitaxial layer can be mounted closest to the mounting structure with respect to the substrate or further from the mounting structure with respect to the substrate. In circumstances where the epitaxial layers are placed on the mounting structure (down), the mirror can be positioned on the epitaxial side of the overall device. Moreover, through-silicon via (TSV) technology, that is widely used with large scale integrated circuit devices, can be used in various embodiments herein to bond a wafer with light emitting diodes to a silicon wafer if desired. The silicon wafer can provide the supporting structure when the silicon carbide substrate is ground to be very thin (for example, less than about 50 μm of silicon carbide) or where the silicon carbide growth substrate is completely removed. Bonding pads may then be provided on the back of the TSV silicon wafer, substantially aligned to the contacts pads of the LED to provide a mounting interface. The TSVs can connect the pads on the LED with the pads on the back of the silicon wafer.

Moreover, some embodiments as described herein can provide an integrated contact stack that includes Al/Ti/Ni/AuSn, with thicknesses of these layers according to some embodiments having been described above. As also described herein, the Al reflective layer can be separated from the Ti/Ni/AuSn. Moreover, the actual bonding metal, for example AuSn, may only need to be thick enough to provide a good bond to whatever substrate the LED will be mounted to. Thus, for metal deposition processes, the AuSn alloy may be sputtered, or sputtering and/or e-beam deposition may be used to sputter individual AuSn layers. Some embodiments may use a thickness of between about 1 μm to about 3 μm but, in other embodiments, thicker layers may be used. Moreover, in some embodiments described above, copper may be thickly plated, for example between about 20 μm and about 30 μm or even thicker, to provide mechanical support.

Accordingly, some embodiments can provide bond pad metal integration, to thereby allow for large area bonding with relatively small gaps between the pads. For example, gaps as small as about 30 μm or less between the AuSn anode and cathode layers may be used without undue concern about bridging. If the termination uses Au rather than AuSn, solders, pastes, preforms, etc. may be used, in which case it may be desirable to provide either larger gaps between the contacts or reduced pad areas to be bonded. However, in some embodiments described herein, only flux may be needed, and the alignment for dispensing may not be critical.

Accordingly, in some embodiments described herein, gaps between the die attach surfaces may be reduced in size to the size of the gap between the anode and cathode contacts. In some embodiments, a gap of less than about 75 μm may be provided and, in other embodiments, a gap of less than about 50 μm may be provided, which can provide excellent mechanical integrity and efficient heat dissipation. Accordingly, some embodiments described herein can provide an integrated reflective contact and heat sink, while allowing a small gap between the die attach surfaces. The LED can then be flip-chip mounted to a submount, such as silicon, copper, aluminum and/or aluminum nitride with traces (for a lead frame-based package), directly onto a lead frame, or lead frame slug or onto a ceramic submount. Such mounting schemes can provide efficient thermal conduction paths away from the active layer.

Although some embodiments can provide advantages with respect to lateral LEDs, other embodiments can also enhance the external efficiency of vertical LEDs. Moreover, the light enhancement designs of various embodiments can offer additional advantages based upon the refractive index of silicon carbide. Specifically, the difference between the refractive index of silicon carbide and air, and between silicon carbide and most common encapsulants, is usually greater than the difference between the refractive index of other substrate materials (such as sapphire) and air or encapsulants. As a result, silicon carbide tends to refract and internally reflect more light than do some other substrate materials. Because of that, enhancing the light output characteristics of the surfaces of silicon carbide-based diodes can have a proportionally greater positive effect on the external quantum efficiency of these devices.

Accordingly, some embodiments may use transparent silicon carbide (index of refraction of about 2.6) to extract light from the GaN-based diode region (index of refraction of about 2.5). Moreover, some embodiments may use ITO (index of refraction of about 1.9) and silicon dioxide (index of refraction of about 1.5) to couple between the GaN (index of refraction of about 2.5) and the reflective layer (such as aluminum). Accordingly, robust electrical, thermal and optical properties may be provided.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A light emitting diode (LED) comprising:
a diode region having first and second opposing faces and including therein an n-type layer and a p-type layer;
at least one dielectric layer on said first face;
a first metal layer on said first face and comprising a portion that passes through said at least one dielectric layer to electrically connect said first metal layer to said p-type layer;
a second metal layer on said first face and comprising a portion that passes through said at least one dielectric layer to electrically connect said second metal layer to said n-type layer, wherein said LED emits light from a side of said LED adjacent to said second face;
a filling layer between said first metal layer and said second metal layer; and
a transparent contact between said first metal layer and said diode region, wherein said transparent contact comprises indium tin oxide (ITO).

2. The LED of claim 1, wherein the diode region has a first index of refraction, the transparent contact has a second index of refraction that is lower than the first index of refraction, and the at least one dielectric layer has a third index of refraction that is lower than the second index of refraction.

3. The LED of claim 1, wherein at least one of said first and second metal layers is reflective.

4. The LED of claim 1, wherein said transparent contact is between said dielectric layer and said diode region.

5. The LED of claim 1, wherein said at least one dielectric layer is transparent.

6. The LED of claim 1, wherein said at least one dielectric layer comprises silicon dioxide ($SiO_2$).

7. The LED of claim 1, wherein said at least one dielectric layer comprises multiple layers.

8. The LED of claim 1, wherein said at least one dielectric layer comprises a distributed Bragg reflector (DBR).

9. The LED of claim 1, wherein said transparent contact comprises a transparent conductive oxide.

10. The LED of claim 1, wherein said first and second metal layers extend on said first face to collectively cover at least about 85% of said first face.

11. The LED of claim 1, wherein said first and second metal layers extend on said first face to collectively cover at least about 90% of said first face.

12. The LED of claim 1, wherein said first and second metal layers extend on said first face to collectively cover at least about 93% of said first face.

13. The LED of claim 1, further comprising:
a reflective contact electrically connecting said second metal layer to said n-type layer; and
a transparent insulating layer extending on said transparent contact,
wherein said reflective contact also extends on said transparent insulating layer that is on said transparent contact to cover at least a portion of said transparent contact.

14. The LED of claim 1, further comprising a current spreading layer between said first metal layer and said transparent contact.

15. The LED of claim 1, wherein the portion of said first metal layer that passes through said at least one dielectric layer is defined by a via.

16. The LED of claim 1, wherein the portion of said second metal layer that passes through said at least one dielectric layer is defined by a via.

17. The LED of claim 1, wherein said first and second metal layers extend on said first face in closely spaced apart relation to one another to define a gap there between.

18. The LED of claim 17, wherein said filling layer fills the gap.

19. The LED of claim 17, wherein the filling layer comprises polyimide.

20. The LED of claim 17, wherein the filling layer completely fills the gap.

21. The LED of claim 17, wherein the gap is approximately 75 micrometers wide.

22. The LED of claim 1, wherein said at least one dielectric layer has an index of refraction of approximately 2 or less.

23. The LED of claim 1, wherein said at least one dielectric layer has an index of refraction of approximately 1.5 or less.

24. A light emitting diode (LED) comprising:
a diode region having first and second opposing faces and including therein an n-type layer and a p-type layer;
an anode pad that electrically contacts said p-type layer and extends on the first face;
a cathode pad that electrically contacts the n-type layer and also extends on the first face, such that a gap is defined that extends along the first face between the anode and cathode pads, wherein the anode and cathode pads are adjacent to each other and extend to said gap therebetween; and
a filling layer in the gap.

25. The LED of claim 24, wherein the filling layer comprises polyimide.

26. The LED of claim 24, wherein the filling layer completely fills the gap.

27. The LED of claim 24, wherein the gap is approximately 75 micrometers wide.

28. A light emitting diode (LED) comprising:
an n-type semiconductor layer;
a p-type semiconductor layer;
an anode contact electrically contacting said p-type layer;
a cathode contact electrically contacting said n-type layer and electrically isolated from said anode;
wherein said cathode contact overlaps said anode contact and contacts said n-type layer.

29. The LED of claim 28, further comprising a growth substrate on said n-type layer opposite said p-type layer.

30. The LED of claim 28, wherein said cathode contact comprises at least one via portion that extends through said p-type layer to electrically connect to said n-type layer.

31. The LED of claim 30, wherein said at least one via portion is surrounded by a sidewall of said p-type layer and electrically isolated therefrom by said insulating layer.

32. The LED of claim 30, wherein said at least one via portion is at least partially surrounded by a sidewall of said p-type layer and electrically isolated therefrom by said insulating layer.

33. The LED of claim 28, wherein said cathode contact comprises a plurality of distinct via portions that extend through said p-type layer to electrically connect to said n-type layer.

34. The LED of claim 28, further comprising an insulating layer that electrically isolates said anode contact and said cathode contact.

35. The LED of claim 34, wherein said insulating layer is optically transparent.

36. The LED of claim 34, said insulating layer having an index of refraction of approximately 2 or less.

37. The LED of claim 34, said insulating layer having an index of refraction of approximately 1.5 or less.

38. The LED of claim 28, wherein said cathode contact contacts said n-type layer on multiple sides of said anode contact.

* * * * *